US009991095B2

(12) United States Patent
Sweeney et al.

(10) Patent No.: US 9,991,095 B2
(45) Date of Patent: Jun. 5, 2018

(54) ION SOURCE CLEANING IN SEMICONDUCTOR PROCESSING SYSTEMS

(75) Inventors: Joseph D. Sweeney, Winsted, CT (US); Sharad N. Yedave, Danbury, CT (US); Oleg Byl, Southbury, CT (US); Robert Kaim, Brookline, MA (US); David Eldridge, Liberty Hill, TX (US); Lin Feng, Orange, CT (US); Steven E. Bishop, Corrales, NM (US); W. Karl Olander, Indian Shores, FL (US); Ying Tang, Brookfield, CT (US)

(73) Assignee: Entegris, Inc., Danbury, MA (US)

( * ) Notice: Subject to any disclaimer, the term of this patent is extended or adjusted under 35 U.S.C. 154(b) by 1388 days.

(21) Appl. No.: 13/201,188

(22) PCT Filed: Aug. 12, 2009

(86) PCT No.: PCT/US2009/053520
§ 371 (c)(1),
(2), (4) Date: Nov. 17, 2011

(87) PCT Pub. No.: WO2010/093380
PCT Pub. Date: Aug. 19, 2010

(65) Prior Publication Data
US 2012/0058252 A1 Mar. 8, 2012

Related U.S. Application Data

(63) Continuation-in-part of application No. PCT/US2009/033754, filed on Feb. 11, 2009.

(60) Provisional application No. 61/027,824, filed on Feb. 11, 2008.

(51) Int. Cl.
| | |
|---|---|
| *B05D 5/12* | (2006.01) |
| *H01J 37/317* | (2006.01) |
| *C23C 14/48* | (2006.01) |
| *C23C 14/54* | (2006.01) |
| *C23C 14/56* | (2006.01) |
| *H01J 37/08* | (2006.01) |
| *H01J 37/16* | (2006.01) |
| *H01J 37/18* | (2006.01) |

(52) U.S. Cl.
CPC .......... *H01J 37/3171* (2013.01); *C23C 14/48* (2013.01); *C23C 14/54* (2013.01); *C23C 14/564* (2013.01); *H01J 37/08* (2013.01); *H01J 37/16* (2013.01); *H01J 37/18* (2013.01); *H01J 2237/082* (2013.01); *H01J 2237/22* (2013.01)

(58) Field of Classification Search
USPC ........................... 134/31; 250/426, 424, 423
See application file for complete search history.

(56) References Cited

U.S. PATENT DOCUMENTS

| | | |
|---|---|---|
| 3,602,778 A | 8/1971 | Ura et al. |
| 3,615,203 A | 10/1971 | Kaneko et al. |
| 3,625,749 A | 12/1971 | Yoshioka et al. |
| 3,658,586 A | 4/1972 | Wang |
| 3,725,749 A | 4/1973 | Groves et al. |
| 4,100,310 A | 7/1978 | Ura et al. |
| 4,128,733 A | 12/1978 | Fraas et al. |
| 4,369,031 A | 1/1983 | Goldman et al. |
| 4,498,953 A | 2/1985 | Cook et al. |
| 4,600,801 A | 7/1986 | Guha et al. |
| 4,619,729 A | 10/1986 | Johncock et al. |
| 4,718,240 A | 1/1988 | Andeen et al. |
| 4,883,969 A | 11/1989 | Ishida et al. |
| 5,144,147 A | 9/1992 | Shiozaki et al. |
| 5,347,460 A | 9/1994 | Gifford et al. |
| 5,370,568 A | 12/1994 | Ivins et al. |
| 5,413,670 A | 5/1995 | Langan et al. |
| 5,421,957 A | 6/1995 | Carlson et al. |
| 5,436,180 A | 7/1995 | de Fresart et al. |
| 5,497,006 A * | 3/1996 | Sferlazzo et al. ............ 250/427 |
| 5,516,366 A | 5/1996 | Kanno et al. |
| 5,518,528 A | 5/1996 | Tom et al. |
| 5,554,845 A | 9/1996 | Russell |
| 5,554,854 A | 9/1996 | Blake |
| 5,565,038 A | 10/1996 | Ashley |
| 5,620,526 A | 4/1997 | Watatani et al. |
| 5,633,506 A | 5/1997 | Blake |
| 5,767,021 A | 6/1998 | Imai et al. |
| 5,834,371 A | 11/1998 | Ameen et al. |
| 5,851,270 A | 12/1998 | Olander |
| 5,940,724 A | 8/1999 | Warren |
| 5,943,594 A * | 8/1999 | Bailey et al. ................. 438/514 |
| 5,977,552 A | 11/1999 | Foad |

(Continued)

FOREIGN PATENT DOCUMENTS

| | | |
|---|---|---|
| EP | 0474108 A1 | 3/1992 |
| EP | 0714999 A1 | 6/1996 |

(Continued)

OTHER PUBLICATIONS

The Development of InSitu Ion Implant Cleaning Processes, AIP Conference Proceedings p. 477-480 (2006).*
Bishop et al., "The development of insitu ion implant cleaning processes" (Nov. 13, 2006).*
Aug. 1, 2012 Office Action in U.S. Appl. No. 12/867,245, issued by Natasha N. Campbell.
Note: Applicant hereby offers to furnish examiner upon request with a the Office Action cited herein.
Arno, J., et al. , "Fluorine Gas: Safe Packaging and Application of a Non-Global Warming Gas for Semiconductor Materials Processing", "Micromagazine: Semicon Southwest 2000", Oct. 2000, pp. 1-6.
Arno, J., et al. , "Safe Fluorine Gas Source for Semiconductor Materials Processing", "Electrochemical Society Proceedings", Spring 2001, pp. 48-58, vol. 2001-6.
Bartlett, N., "Xenon hexafluoroplatinate(v) Xe+[PtF sub 6]–", "Proc. Chem. Society", Jun. 1962, p. 218.

(Continued)

*Primary Examiner* — Austin Murata
(74) *Attorney, Agent, or Firm* — Entegris, Inc.

(57) ABSTRACT

Cleaning of an ion implantation system or components thereof, utilizing temperature and/or a reactive cleaning reagent enabling growth/etching of the cathode in an indirectly heated cathode for an ion implantation system by monitoring the cathode bias power and taking corrective action depending upon compared values to etch or regrow the cathode.

7 Claims, 8 Drawing Sheets

(56) References Cited

U.S. PATENT DOCUMENTS

| | | | |
|---|---|---|---|
| 5,988,187 A | 11/1999 | Trussell et al. | |
| 6,033,973 A | 3/2000 | Takemura | |
| 6,077,355 A | 6/2000 | Yamashita et al. | |
| 6,080,297 A | 6/2000 | Ayers | |
| 6,089,027 A | 7/2000 | Wang et al. | |
| 6,101,816 A | 8/2000 | Wang et al. | |
| 6,135,128 A | 10/2000 | Graf et al. | |
| 6,143,191 A | 11/2000 | Baum et al. | |
| 6,221,169 B1 | 4/2001 | Bernstein et al. | |
| 6,224,785 B1 | 5/2001 | Wojtczak et al. | |
| 6,254,792 B1 | 7/2001 | Van Buskirk et al. | |
| 6,259,105 B1 | 7/2001 | Eddy et al. | |
| 6,267,909 B1 | 7/2001 | Currie et al. | |
| 6,290,864 B1 | 9/2001 | Patel et al. | |
| 6,306,807 B1 | 10/2001 | Wojtczak et al. | |
| 6,322,600 B1 | 11/2001 | Brewer et al. | |
| 6,322,756 B1 | 11/2001 | Arno et al. | |
| 6,333,272 B1 | 12/2001 | McMillin et al. | |
| 6,344,432 B1 | 2/2002 | Wojtczak et al. | |
| 6,346,452 B1 | 2/2002 | Kabir et al. | |
| 6,355,933 B1 | 3/2002 | Tripsas et al. | |
| 6,379,575 B1 | 4/2002 | Yin et al. | |
| 6,409,876 B1 | 6/2002 | McQuarrie et al. | |
| 6,534,007 B1 | 3/2003 | Blonigan et al. | |
| 6,559,462 B1 | 5/2003 | Carpenter et al. | |
| 6,566,315 B2 | 5/2003 | Wojtczak et al. | |
| 6,620,225 B2 | 9/2003 | Wang et al. | |
| 6,620,256 B1 | 9/2003 | Arno et al. | |
| 6,685,803 B2 | 2/2004 | Lazarovich et al. | |
| 6,699,399 B1 | 3/2004 | Qian et al. | |
| 6,709,610 B2 | 3/2004 | Van Buskirk et al. | |
| 6,718,126 B2 | 4/2004 | Lei | |
| 6,756,600 B2 | 6/2004 | Ng et al. | |
| 6,767,836 B2 | 7/2004 | San et al. | |
| 6,772,781 B2 | 8/2004 | Doty et al. | |
| 6,812,648 B2 | 11/2004 | Luten et al. | |
| 6,835,414 B2 | 12/2004 | Ramm | |
| 6,841,141 B2 | 1/2005 | Arno et al. | |
| 6,843,258 B2 | 1/2005 | Shang et al. | |
| 6,843,858 B2 | 1/2005 | Rossman | |
| 6,846,424 B2 | 1/2005 | Baum et al. | |
| 6,851,432 B2 | 2/2005 | Naghshineh et al. | |
| 6,880,561 B2 | 4/2005 | Goto et al. | |
| 6,887,337 B2 | 5/2005 | Lebouitz et al. | |
| 6,902,629 B2 | 6/2005 | Zheng et al. | |
| 6,913,653 B2 | 7/2005 | Kanayama et al. | |
| 6,921,062 B2 | 7/2005 | Gregg et al. | |
| 6,939,409 B2 | 9/2005 | Kanayama et al. | |
| 7,037,376 B2 | 5/2006 | Harvey et al. | |
| 7,037,813 B2 | 5/2006 | Collins et al. | |
| 7,080,545 B2 | 7/2006 | Dimeo, Jr. et al. | |
| 7,168,436 B2 | 1/2007 | Mouri et al. | |
| 7,186,385 B2 | 3/2007 | Ganguli et al. | |
| 7,201,174 B2 | 4/2007 | Fukiage | |
| 7,201,807 B2 | 4/2007 | Yim et al. | |
| 7,228,724 B2 | 6/2007 | Chen et al. | |
| 7,288,491 B2 | 10/2007 | Collins et al. | |
| 7,296,458 B2 | 11/2007 | Dimeo, Jr. et al. | |
| 7,296,460 B2 | 11/2007 | Dimeo, Jr. et al. | |
| 7,300,038 B2 | 11/2007 | Gregg et al. | |
| 7,487,956 B2 | 2/2009 | Gregg et al. | |
| 7,556,244 B2 | 7/2009 | Gregg et al. | |
| 7,819,981 B2 | 10/2010 | Dimeo, Jr. et al. | |
| 7,919,402 B2 | 4/2011 | Jacobson et al. | |
| 7,943,204 B2 | 5/2011 | Olander et al. | |
| 7,947,582 B2 | 5/2011 | Hautala et al. | |
| 8,013,312 B2 | 9/2011 | Adams | |
| 8,021,492 B2 | 9/2011 | Poh et al. | |
| 8,187,971 B2 | 5/2012 | Russell et al. | |
| 8,237,136 B2 | 8/2012 | Hautala et al. | |
| 8,252,651 B2 | 8/2012 | Kawasaki | |
| 8,603,252 B2 * | 12/2013 | Dimeo | C23C 14/564 134/1.1 |
| 2001/0016674 A1 | 8/2001 | Pang et al. | |
| 2002/0011463 A1 | 1/2002 | Van Buskirk et al. | |
| 2002/0014407 A1 | 2/2002 | Allen et al. | |
| 2002/0018897 A1 | 2/2002 | Kuckertz et al. | |
| 2002/0033229 A1 | 3/2002 | Lebouitz et al. | |
| 2002/0083961 A1 | 7/2002 | Tsuga | |
| 2002/0145711 A1 | 10/2002 | Magome et al. | |
| 2002/0155724 A1 | 10/2002 | Sakai et al. | |
| 2002/0172080 A1 | 11/2002 | Koutsoures | |
| 2003/0000385 A1 | 1/2003 | Kawai et al. | |
| 2003/0019580 A1 | 1/2003 | Strang | |
| 2003/0023118 A1 | 1/2003 | Kanayama et al. | |
| 2003/0053799 A1 | 3/2003 | Lei | |
| 2003/0098038 A1 | 5/2003 | Siegele et al. | |
| 2003/0183244 A1 | 10/2003 | Rossman | |
| 2004/0002170 A1 | 1/2004 | Shimizu et al. | |
| 2004/0006249 A1 | 1/2004 | Hoshino et al. | |
| 2004/0018746 A1 | 1/2004 | Arno | |
| 2004/0074285 A1 | 4/2004 | Dimeo, Jr. et al. | |
| 2004/0080050 A1 | 4/2004 | McMillin et al. | |
| 2004/0083962 A1 | 5/2004 | Bang et al. | |
| 2004/0108296 A1 | 6/2004 | Kanayama et al. | |
| 2004/0163445 A1 | 8/2004 | Dimeo, Jr. et al. | |
| 2004/0166612 A1 | 8/2004 | Maydan et al. | |
| 2004/0187557 A1 | 9/2004 | Chen et al. | |
| 2004/0235280 A1 | 11/2004 | Keys et al. | |
| 2004/0242018 A1 | 12/2004 | Rusli | |
| 2005/0016838 A1 | 1/2005 | Murata et al. | |
| 2005/0109419 A1 | 5/2005 | Ohmi et al. | |
| 2005/0191816 A1 | 9/2005 | Vanderpool et al. | |
| 2005/0211923 A1 | 9/2005 | Banks | |
| 2005/0230046 A1 | 10/2005 | Lebouitz et al. | |
| 2005/0252529 A1 | 11/2005 | Ridgeway et al. | |
| 2005/0260354 A1 | 11/2005 | Singh et al. | |
| 2006/0005856 A1 | 1/2006 | Sun et al. | |
| 2006/0019039 A1 | 1/2006 | Hanawa et al. | |
| 2006/0086276 A1 | 4/2006 | Theilacker | |
| 2006/0086376 A1 | 4/2006 | Dimeo, Jr. et al. | |
| 2006/0088948 A1 | 4/2006 | McManus et al. | |
| 2006/0097193 A1 | 5/2006 | Horsky et al. | |
| 2006/0115590 A1 | 6/2006 | Suzuki et al. | |
| 2006/0169915 A1 | 8/2006 | Olson et al. | |
| 2006/0174941 A1 | 8/2006 | Cohen et al. | |
| 2006/0272775 A1 | 12/2006 | Horsky et al. | |
| 2006/0272776 A1 | 12/2006 | Horsky et al. | |
| 2007/0108395 A1 | 5/2007 | Horsky et al. | |
| 2007/0117396 A1 | 5/2007 | Wu et al. | |
| 2007/0148888 A1 | 6/2007 | Krull et al. | |
| 2007/0172361 A1 | 7/2007 | Manson et al. | |
| 2007/0210260 A1 | 9/2007 | Horsky et al. | |
| 2007/0241689 A1 | 10/2007 | Horsky et al. | |
| 2007/0259111 A1 | 11/2007 | Singh et al. | |
| 2008/0121811 A1 | 5/2008 | Horsky et al. | |
| 2008/0129209 A1 | 6/2008 | Deakins et al. | |
| 2008/0142039 A1 | 6/2008 | Chen et al. | |
| 2008/0191153 A1 | 8/2008 | Marganski et al. | |
| 2008/0223409 A1 | 9/2008 | Horsky et al. | |
| 2008/0248636 A1 | 10/2008 | Olander et al. | |
| 2008/0280380 A1 | 11/2008 | Dietz et al. | |
| 2008/0305598 A1 | 12/2008 | Horsky et al. | |
| 2009/0095713 A1 | 4/2009 | Dimeo, Jr. et al. | |
| 2010/0022095 A1 | 1/2010 | Wu et al. | |
| 2010/0112795 A1 | 5/2010 | Kaim et al. | |
| 2010/0154835 A1 | 6/2010 | Dimeo et al. | |
| 2011/0079241 A1 | 4/2011 | Sinha et al. | |
| 2011/0259366 A1 | 10/2011 | Sweeney et al. | |

FOREIGN PATENT DOCUMENTS

| | | |
|---|---|---|
| EP | 0839929 A1 | 5/1998 |
| EP | 0945892 A2 | 9/1999 |
| EP | 1061550 A2 | 12/2000 |
| EP | 1428907 A1 | 6/2004 |
| GB | 2412488 A | 9/2005 |
| JP | 60-138247 A | 7/1985 |
| JP | 63-48730 A | 3/1988 |
| JP | 1-265511 A | 10/1989 |
| JP | 3-246863 A | 11/1991 |
| JP | 4-333572 A | 11/1992 |
| JP | 08-055804 A | 2/1996 |
| JP | 8-232069 A | 9/1996 |

(56) References Cited

FOREIGN PATENT DOCUMENTS

| | | |
|---|---|---|
| JP | H09-298166 A | 11/1997 |
| JP | 10-317169 A | 12/1998 |
| JP | 10-332091 A | 12/1998 |
| JP | 11-317174 A | 11/1999 |
| JP | H11-354068 A | 12/1999 |
| JP | 2000222724 A | 8/2000 |
| JP | 2000-340165 A | 12/2000 |
| JP | 2000-350970 A | 12/2000 |
| JP | 2001167728 A | 6/2001 |
| JP | 2001-520463 A | 10/2001 |
| JP | 2003-45858 A | 2/2003 |
| JP | 2003-164720 A | 6/2003 |
| JP | 2003-272554 A | 9/2003 |
| JP | 2003-297280 A | 10/2003 |
| JP | 2004-134741 A | 4/2004 |
| JP | 2005-533179 A | 11/2005 |
| JP | 2007-190448 A | 8/2007 |
| JP | 2007-531214 A | 11/2007 |
| JP | 2008-518482 A | 5/2008 |
| JP | 2009-021066 A | 1/2009 |
| TW | 200715338 A | 4/2007 |
| TW | 200802564 A | 1/2008 |
| TW | 200839829 A | 10/2008 |
| WO | 9920812 A1 | 4/1999 |
| WO | 99/47728 A1 | 9/1999 |
| WO | 02/50883 A1 | 6/2002 |
| WO | 0250884 A1 | 6/2002 |
| WO | 02055756 A1 | 7/2002 |
| WO | 2004003973 A2 | 1/2004 |
| WO | 2004007793 A2 | 1/2004 |
| WO | 2005059942 A2 | 6/2005 |
| WO | 2005060602 A2 | 7/2005 |
| WO | 2005072252 A2 | 8/2005 |
| WO | 2005/114692 A2 | 12/2005 |
| WO | 2006005907 A2 | 1/2006 |
| WO | 2006047373 A2 | 5/2006 |
| WO | 2007/027965 A2 | 3/2007 |
| WO | 2007127865 A2 | 11/2007 |
| WO | 2009102762 A2 | 8/2009 |

OTHER PUBLICATIONS

Chang, F., et al., "Gas-phase silicon micromachining with xenon difluoride", "Proceedings of SPIE", Oct. 1995, pp. 117-128, vol. 2641.

Chernick, C., et al., "Fluorine Compounds of Xenon and Radon", "Science", Oct. 1962, pp. 136-138, vol. 138, No. 3537.

Fleming, J., et al., "Sequential deposition etch techniques for the selective deposition of tungsten", "1991 Tungsten Workshop, Murray Hill, NJ, Oct. 8", Jan. 1991, Publisher: Sandia National Laboratories.

Ibbotson, D., et al., "Plasmaless dry etching of silicon with fluorine-containing compounds", "Journal of Applied Physics", Nov. 1984, pp. 2939-2942, vol. 56, No. 10 (Abstract).

Reisman, A., et al., "Selective Tungsten on Silicon by the Alternating Cyclic, AC, Hydrogen Reduction of WF6", "J. Electrochem. Soc.", Feb. 1990, pp. 722-727, vol. 137, No. 2.

Saito, Y., et al., "Plasmaless cleaning process of silicon surface using chlorine trifluoride", "Appl. Phys. Lett.", Mar. 1990, pp. 1119-1121, vol. 56, No. 12 (Abstract).

Vugts, M., et al., "Si/XeF2 etching: Temperature dependence", "J. Vac. Sci. Technol. A", Sep./Oct. 1996, pp. 2766-2774, vol. 14, No. 5.

Walther, S., et al., "Ion Sources for Commercial Ion Implanter Applications", "14th IEEE Particle Accelerator Conference, San Francisco, CA, May 6-9", May 1991, pp. 2088-2092.

Williams, K., et al., "Etch rates for micromachining processing", "Journal of Microelectromechanical Systems", Dec. 1996, pp. 256-269, vol. 5, No. 4.

Winters, H., et al., "The etching of silicon with XeF2 vapor", "Appl. Phys. Lett.", Jan. 1979, pp. 70-73, vol. 34, No. 1.

* cited by examiner

ION SOURCE CLEANING IN SEMICONDUCTOR PROCESSING SYSTEMS

CROSS-REFERENCE TO RELATED APPLICATIONS

This application is a U.S. national phase filed under the provisions of 35 U.S.C. § 371 of International Patent Application No. PCT/US09/53520 filed Aug. 12, 2009, which in turn claims priority under 35 U.S.C. § 120 as a continuation in part of International Patent Application No. PCT/US09/33754 filed Feb. 11, 2009, which in turn claims the benefit of priority of U.S. Provisional Patent Application No. 61/027,824 filed Feb. 11, 2008. The disclosures of such applications are hereby incorporated herein by reference in their respective entireties, for all purposes.

FIELD OF THE INVENTION

The present invention relates to monitoring, control and cleaning of material deposition on components of semiconductor processing systems, in particular to ion implantation systems.

DESCRIPTION OF THE RELATED ART

Ion implantation is used in integrated circuit fabrication to accurately introduce controlled amounts of dopant impurities into semiconductor wafers and is a crucial process in microelectronic/semiconductor manufacturing. In such implantation systems, an ion source ionizes a desired dopant element gas and the ions are extracted from the source in the form of an ion beam of desired energy. Extraction is achieved by applying a high voltage across suitably shaped extraction electrodes, which incorporate apertures for passage of the extracted beam. The ion beam is then directed at the surface of the workpiece, such as a semiconductor wafer, in order to implant the workpiece with the dopant element. The ions of the beam penetrate the surface of the workpiece to form a region of desired conductivity.

Several types of ion sources are commonly used in commercial ion implantation systems, including the Freeman and Bemas types using thermoelectrodes and powered by an electric arc, a microwave type using a magnetron, indirectly heated cathode sources, and RF plasma sources, all of which typically operate in a vacuum. The ion source generates ions by introducing electrons into a vacuum chamber filled with the dopant gas (commonly referred to as the "feedstock gas"). Collisions of the electrons with dopant atoms and molecules in the gas results in the creation of ionized plasma consisting of positive and negative dopant ions. An extraction electrode with a negative or positive bias will respectively allow the positive or negative ions to pass through the aperture and out of the ion source as a collimated ion beam, which is accelerated towards the workpiece. Feedstock gases include, but are not limited to, $BF_3$, $B_{10}H_{14}$, $B_{18}H_{22}$, $PH_3$, $AsH_3$, $PF_5$, $AsF_5$, $H_2Se$, $N_2$, Ar, $GeF_4$, $SiF_4$, $O_2$, $H_2$, and $GeH_4$.

Presently, there are upwards of 10-15 implantation steps in the fabrication of state of the art devices. Increasing wafer sizes, decreasing critical dimensions, and growing circuit complexity are placing greater demands on ion implant tools, with respect to better process control, the deliverance of high beam currents at low energies, and a decrease in the mean time between failures (MTBF).

The parts of the ion implanter tool that require the most maintenance include: the ion source, which must be serviced after approximately 100 to 300 hours of operation, depending on its operating conditions; the extraction electrodes and the high voltage insulator, which usually require cleaning after a few hundred hours of operation; the forelines and vacuum pumps of the ion implant vacuum system, including the ion source turbo pump and its associated forelines. Additionally, various components of the ion source, such as the filament, cathode and the like, can require replacement after operation.

In the ideal case, all feedstock molecules would be ionized and extracted, but in reality a certain amount of feedstock decomposition occurs, which results in the deposition on and contamination of the ion source region. For example, phosphorous residue (e.g., deriving from use of a feedstock gas such as phosphine) readily deposits on surfaces in the ion source region. The residue can form on low voltage insulators in the ion source, causing electrical short circuits, which can interrupt the arc required to produce thermionic electrons. This phenomenon is generally known as "source glitching," and it is a major contributor to ion beam instability, and may eventually cause premature failure of the source. The residue also forms on the high voltage components of the ion implanter, such as the source insulator or the surfaces of the extraction electrodes, causing energetic high voltage sparking. Such sparks are another contributor to beam instability, and the energy released by these sparks can damage sensitive electronic components, leading to increased equipment failures and poor MTBF.

Another common problem can occur with antimony (Sb+) implant using $Sb_2O_3$ as the solid doping material, which can be exacerbated by running boron (B) even after only a few hours of Sb+ implantation. The boron beam current can significantly deteriorate with performance and lifetime of ion source significantly compromised. The cause of this degradation in performance is due to the excessive Sb deposited on the source chamber and its components. Failure of the ion source significantly reduces implanter productivity as throughput is reduced due to more frequent preventive maintenance or less beam current. Since Sb implantation is widely used in analog bipolar devices, and also used as n-type doping for shallow junction formation for MOS (metal oxide semiconductor) devices, there is a need in the art to develop a method which can remove Sb deposited on the source chamber and components thereof when Sb+ is used as dopant, particularly when switching to B after Sb implant.

Furthermore, dopant atoms such as B, Ge, Si, P, and As may deposit in the ion source turbo pump, downstream in its associated vacuum forelines, and roughing pump which is located downstream of the forelines. Over time, these deposits build up and require cleaning, which, historically, has been done manually. But some of the deposits (e.g. solid phosphorus) are pyrophoric and can ignite during the manual maintenance operations. Not only is this a fire hazard, but toxic compounds also can be liberated. There is thus a need in the art to develop an improved method which can desirably clean the deposits in-situ with a gaseous cleaning agent.

In another cause of ion source failure, various materials (e.g. tungsten, W) can accumulate on the cathode during extended ion implantation processes. Once these reach a critical level, the cathode power can no longer maintain temperature sufficient to meet the beam current setpoint. This causes loss of ion beam current requiring replacement of the ion source. The resultant performance degradation and short lifespan of the ion source reduces productivity of the ion implanter system.

Yet another cause of ion source failure is the erosion (or sputtering) of cathode material. For example, metallic materials (e.g. W, Mo etc.) from the cathode are sputtered by ions in the plasma of the arc chamber. Because sputtering is dominated by the heaviest ions in the plasma, as ion mass increases the sputtering effect may worsen. In fact, continued sputtering of material "thins" the cathode eventually leading to formation of a hole in the cathode ("cathode punch-through"). Performance and lifetime of the ion source are greatly reduced as a result. The art thus continues to seek methods which can maintain a balance between the accumulation and erosion of material on the cathode to prolong the ion source life.

Further residue may result from reaction of the source material with the components of the ion implantation system, depending on the conditions within the system. Such reaction may result in deposition of residue on additional components of the system. For instance, tungsten whiskers may form on the arc chamber extraction aperture, resulting in beam non-uniformity issues.

Deposits are common on ion source elements such as the filament and the repeller electrode. Such internal deposits are generally composed of arc chamber material, and are most commonly seen when running high plasma power with a fluoride source feedstock in conjunction with an arc chamber constructed of tungsten or molybdenum. While the ion source life expectancy for ion implantation systems using non halide-containing source materials is generally around 100 to 300 hours, with some halide-containing materials such as $GeF_4$, the ion source life can be as low as 10 to 50 hours due to the detrimental effects of internal deposits on source operation.

In addition to the operational difficulties caused by residues in the ion implanter, there are also significant personnel safety issues due to the emission of toxic or corrosive vapors when components are removed for cleaning. The safety issues arise wherever residues are present, but are of particular concern in the ion source region because the ion source is the most frequently maintained component of the ion implanter. To minimize down time, contaminated ion sources are often removed from the implanter at temperatures significantly above room temperature, which increases the emission of vapors and exacerbates the safety issue.

Prior methods of dealing with the above difficulties have included attempts to prevent formation of the deposits and cleaning of the resulting deposits on the extraction electrode and the ion source (i.e. on the extraction electrode, as discussed in published U.S. Patent Application 2006/0272776, published U.S. Patent Application 2006/0272775 and published International Patent Application WO 2005/059942 A2). However, a need for additional processes of cleaning of all elements of an ion implantation system remains.

It would therefore be desirable in the art of ion implantation to provide an ex situ cleaning process with a separate cleaning station whereby contaminated components that have been removed from the implanter can be cleaned safely without any mechanical abrasion which might damage delicate components such as graphite electrodes. It would therefore also be a significant advance in the art of ion implantation to provide an off-line cleaning station that could be used to selectively and non-destructively clean components following removal from the implant system and with minimal down time.

It would also be a significant advance in the art of ion implantation to provide an in situ cleaning process for the effective, selective removal of unwanted residues deposited throughout the implanter, particularly in the ion source region, during implantation. Such in situ cleaning would enhance personnel safety and contribute to stable, uninterrupted operation of the implantation equipment.

An in situ cleaning process is performed without disassembly of the process chamber. For in situ processes, a gaseous agent is flowed through the process chamber to remove accumulated films, in either a continuous, pulsed, or hybrid continuous-pulsed fashion. Depending on the situation, a plasma may or may not be generated during such cleaning.

Plasmaless or dry cleaning processes using chlorine trifluoride ($ClF_3$) and other fluorine source materials (e.g., $CF_4$, $NF_3$, $C_2F_6$, $C_3F_8$, $SF_6$ and $ClF_3$) can be used for removing solid residues from semiconductor processing chambers, e.g., by reacting with solid residues to form volatile reaction products that are removable from the processing chamber by vacuum or other removal conditions, and in such instances these cleaning reagents may require elevated temperature cleaning conditions. See Y. Saito et al., "Plasmaless Cleaning Process of Silicon Surface Using Chlorine Trifluoride", APPLIED PHYSICS LETTERS, vol. 56(8), pp. 1119-1121 (1990); also see D. E. Ibbotson et al., "Plasmaless Dry Etching of Silicon with Fluorine-Containing Compounds", JOURNAL OF APPLIED PHYSICS, vol. 56(10), pp. 2939-2942 (1984).

U.S. Pat. No. 4,498,953 describes an in-situ cleaning method in which an interhalogen, such as $BrF_5$, $BrF_3$, $ClF_3$, or $IF_5$ is continuously flowed through the processing chamber while maintaining a predetermined pressure within the chamber. At the end of the treatment, the flow of the interhalogen gas is terminated. Such processes can produce byproduct containing Cl, Br, or I, as well as byproduct containing fluorine, thereby yielding significant amounts of hazardous waste material that require treatment or other disposition. In addition, such continuous flow cleaning is performed under very low pressure conditions, at which cleaning efficiency is substantially reduced.

In some ion source applications, strategic sequencing of $BF_3$, $PH_3$, and/or $AsH_3$ has been performed in order to achieve longer ion source lifetimes.

The use of fluorine radicals or fluorine-containing interhalogens for cleaning of semiconductor processing equipment has associated deficiencies that have constrained its commercial viability. Fluorine radicals and fluorine-containing interhalogens, including $ClF_3$, are highly corrosive in character. Further, interhalogen compounds are severe irritants to the human respiratory tract. For example, the threshold human tolerance levels of $ClF_3$ vapor can be as low as 100 ppb, with an LC50 on the order of 1 hour at 300 ppm.

The art continues to seek new cleaning reagents and ex situ and in situ systems and processes, and associated monitoring and control apparatus and methods.

SUMMARY OF THE INVENTION

The present invention relates generally to apparatus and methods for monitoring, control, and cleaning of ion implantation systems or components thereof, as well as to compositions usefully employed for such cleaning.

In one aspect the invention provides a method of monitoring the condition of the filament of an ion implantation system during operation of the system comprising: (a) energizing a filament in an arc chamber of an ion source with an initial current sufficient to generate a plasma in said arc chamber; (b) measuring current input to the filament to maintain the plasma in the arc chamber at a predetermined time of continued plasma generation; (c) comparing the current input measured at the predetermined time to the initial current, and (d) determining from such comparing whether material has been deposited on the filament or whether etching of the filament has occurred, wherein a larger current at the predetermined time, in relation to the initial current, is indicative of deposition of material on the filament, and a smaller current at the predetermined time, in relation to the initial current, is indicative of etching of the filament.

In another aspect the invention provides a method of controlling condition of a filament of an ion implantation system during operation of the system comprising: (a) energizing a filament in an arc chamber of an ion source with an initial current sufficient to generate a plasma in said arc chamber; (b) measuring current input to the filament to maintain the plasma in the arc chamber at a predetermined time of continued plasma generation; (c) comparing the current input measured at the predetermined time to the initial current, (d) determining from such comparing whether material has been deposited on the filament or whether etching of the filament has occurred, wherein a larger current at the predetermined time, in relation to the initial current, is indicative of deposition of material on the filament, and a smaller current at the predetermined time, in relation to the initial current, is indicative of etching of the filament, and (e) in response to the determining, removing deposited material from the filament or depositing additional material on the filament, to an extent reestablishing the initial current input or a current input within a predetermined range of said initial current input. In another embodiment of this aspect, steps (a) to (d) may be performed during the ion implantation process; step (e) may be performed before, after, or between ion implantation processes.

In another aspect the invention provides a method of controlling the condition of an indirectly heated cathode (IHC) source of an ion implantation system during operation of the system comprising: a) determining power usage for the indirectly heated cathode source by measuring cathode bias power supply at a predetermined time; b) comparing the power usage at the predetermined time to initial power; and c) taking corrective actions (i) or (ii) to control the condition of the indirectly heated cathode in response to the comparing whereby (i) etching the indirectly heated cathode if the power usage at the predetermined time is higher than the initial power; or (ii) regrowing the indirectly heated cathode if the power usage at the predetermined time is lower than the initial power. Initial power includes the value of the cathode bias power at a time preceding the measurement at a predetermined time, e.g. it can be the power at the time of start up, or the power under normal operating conditions, or any other preset point in time or value. As will be appreciated by the artisan, the cathode bias power measurement and the initial power value could be in the form of a range or ranges depending upon the implant process or other circumstances. The etching of (c)(i) includes operating the indirectly heated cathode under conditions of low to moderate temperature sufficient for etching. Low to moderate temperatures in this regard are exemplified as being from about room temperature up to about 2000° C. The regrowing of (c)(ii) includes flowing a fluorinated gas in a plasma condition over the indirectly heated cathode wherein the fluorinated gas comprises one or more of $XeF_2$, $XeF_4$, $XeF_6$, $GeF_4$, $SiF_4$, $BF_3$, $AsF_5$, $AsF_3$, $PF_5$, $PF_3$, $F_2$, $TaF_3$, $TaF_5$, $WF_6$, $WF_5$, $WF_4$, $NF_3$, $IF_5$, $IF_7$, $KrF_2$, $SF_6$, $C_2F_6$, $CF_4$, $ClF_3$, $N_2F_4$, $N_2F_2$, $N_3F$, $NFH_2$, $NH_2F$, $BrF_3$, $C_3F_8$, $C_4F_8$, $C_5F_8$, $CHF_3$, $CH_2F_2$, $CH_3F$, $COF_2$, HF, $C_2HF_5$, $C_2H_2F_4$, $C_2H_3F_3$, $C_2H_4F_2$, $C_2H_5F$, $C_3F_6$, and $MoF_6$. The regrowing of (c)(ii) includes operating the indirectly heated cathode under conditions of high temperature sufficient for metal deposition to occur. High temperatures in this regard are exemplified as being greater than 2000° C. Corrective step (c) may be performed before, after, or between ion implantation processes. In addition, for regrowing, the corrective step may be performed during the implantation process if the implanted species is selected from one of the fluorinate gases delineated immediately above. The method steps discussed above and elsewhere herein may be performed by a suitable control device such as a microcontroller, a controller, a microprocessor, etc., and the associated electrical, electronic and/or electromechanical components which are appropriately programmed and/or configured to perform automatic repair or cleaning of the components of the ion source such as the filament, repeller electrode, cathode and anticathode.

In still another aspect the invention provides a method of operating an ion implantation system including a filament or cathode (or other parts of the ion source that may be etched or have deposits such as without limitation the anticathode, repeller and the like) in an arc chamber of an ion source, to maintain operating efficiency of the ion source, said method comprising contacting the filament or cathode or other parts of the ion source as aforesaid with a tungsten reagent under conditions selected from the group consisting of:
  (a) conditions effecting deposition of tungsten on the filament; and
  (b) conditions effecting etching of deposited material from the filament.
  In one embodiment in this regard, the other ion source parts, e.g., the cathode, repeller (which corresponds to the cathode and filament respectively) or the like may be provided with a suitable heating element for adjusting the surface temperatures of the components to selectively etch materials therefrom or deposit material thereon.
  In still another embodiment, the indirectly heated cathode (IHC) ion source may include two cathodes (instead of a cathode and an anticathode). During implantation, one cathode may be operated as an anticathode, and during the repair or corrective process, the temperatures of both cathodes can be controlled to deposit or etch materials as needed.

The invention in a further aspect relates to a method of cleaning one or more components of an ion implantation system for at least partial removal of ionization-related deposits from said one or more components, said method comprising flowing a cleaning gas through the system, under conditions selected from the group consisting of:
  (a) conditions effecting deposition of material on the filament, cathode or other ion source parts as aforesaid; and
  (b) conditions effecting etching of deposited material from the filament, cathode or other ion source parts as aforesaid.

A further aspect of the invention relates to a method of maintaining a predetermined electrical resistance of a filament of an ion source in an arc chamber, comprising contacting the filament with a reagent effective to deposit material on the filament or to etch material from the filament depending on the temperature of the filament relative to the temperature of the arc chamber wall, and controlling the temperature of the filament and the temperature in the arc chamber wall to effect deposition or etching of material at the filament, so as to maintain said predetermined electrical resistance. In general, deposition of material on the filament occurs if the temperature of the filament is sufficiently high (e.g. >2000° C.) as long as the arc chamber walls are low to moderate in temperature (less than the temperature of the filament). Etching material from the filament occurs if the temperature of the filament is low to moderate (e.g. less than about 1500° C.-2000° C.), regardless of the temperature of arc chamber wall, although it is preferable that the temperature of arc chamber wall is either less than or greater than the temperature of the filament.

In another aspect, the invention relates to a method of cleaning an ion implantation system or one or more components thereof, to remove ionization-related deposits therefrom, comprising contacting the ion implantation system or one or more components thereof with $BrF_3$ under conditions in which said $BrF_3$ is chemically reactive with the deposits to effect at least partial removal thereof.

In another aspect, the invention relates to a method of cleaning a foreline of an ion implant system to remove an ionization-related deposit therefrom comprising contacting the foreline of an ion implantation system with a cleaning gas under conditions in which said cleaning gas is chemically reactive with the deposit to at least partially removal same. Such method can improve the performance and extend the lifetime of an ion implant system.

In another aspect, the invention relates to a method of improving the performance and extending the lifetime of an ion implant system, comprising contacting the cathode with a gas mixture comprising at least one cleaning gas and at least one deposition gas wherein said gas mixture balances the deposition of material on the cathode and erosion of the same or other material from the cathode.

Other aspects, features and embodiments of the invention will be more fully apparent from the ensuing disclosure and appended claims.

DETAILED DESCRIPTION OF THE INVENTION

Figure 1:
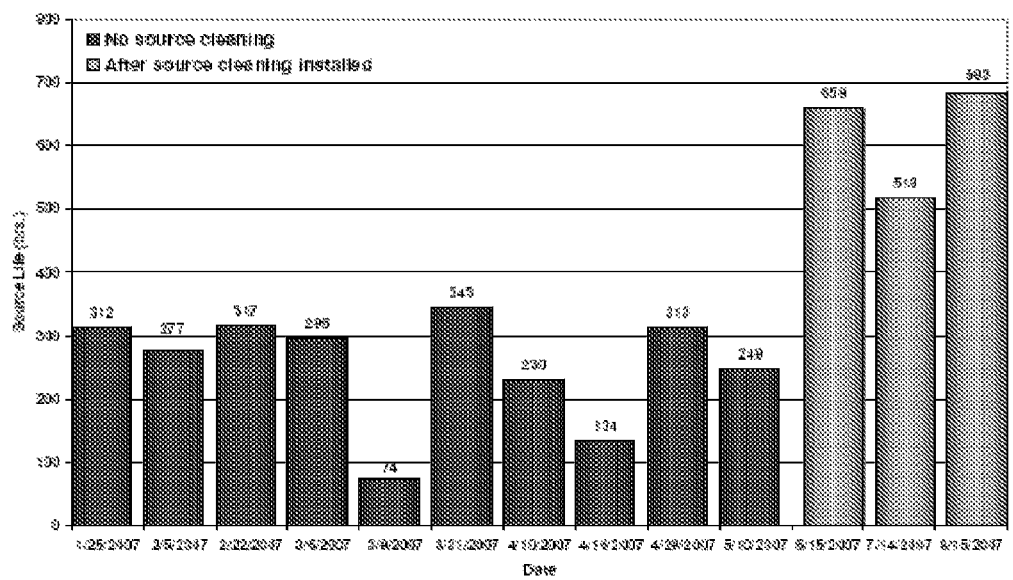
FIG. 1 is a graph of source lifetime data before and after introduction of in situ cleaning processes, showing the increase in lifetime due to the process.

The present invention relates to apparatus and methods for monitoring, control and cleaning of semiconductor processing systems and/or components thereof, and to compositions for such cleaning.

In one aspect the invention relates to removal of deposits from semiconductor processing systems or components of semiconductor processing systems, in which the system or system component is contacted with a cleaning composition including a gas-phase reactive material.

As used herein, the term "gas-phase reactive material" is intended to be broadly construed as meaning material comprising halide compound(s) and/or complex(es), in gaseous or vapor form, ionic and plasma forms of such compound(s) and/or complex(es), and elements and ions derived from such compound(s), complex(es) and ionic and plasma forms. A gas-phase reactive material as utilized in the broad practice of the present invention may also be variously referred to, without limitation, as a "gas-phase reactive composition," a "cleaning agent," a "cleaning gas," an "etchant gas," a "gaseous halide," a "gaseous cleaning agent," a "reactive halide," a "cleaning compound," a "cleaning composition," a "cleaning vapor," an "etchant vapor" or any combination of such teens.

As used herein, "ion source region" in reference to an ion implanter, includes, without limitation, the vacuum chamber, the source arc chamber, the source insulators, the extraction electrodes, the suppression electrodes, the high voltage insulators, the source bushing, the filament, the cathode and the repeller electrode. As will be appreciated by the artisan, the phrase "ion source region" is used in its broadest sense. E.g. a Bernas or Freemen ion source assembly includes a filament and repeller electrode and IHC source assembly includes a cathode and anticathode.

The invention contemplates the cleaning of semiconductor processing systems and components thereof, as well as other substrates and apparatus that are susceptible to formation of deposits thereon during their normal processing operation. Without limitation, such practice includes cleaning of the vacuum forelines and roughing pumps. As will be appreciated by the artisan in view of the description herein, cleaning gases maybe flowed through selected one(s) of a plurality of ports to bypass certain areas and/or target specific areas of the implanter. For example, $XeF_2$ or other cleaning gas may be delivered through a port close to the area where cleaning is desired. Cleaning performance may be enhanced as well insofar as most of the cleaning gas will be directed to the target area and not depleted by reactions with residues along the flow path as may occur if e.g. the cleaning gas is introduced solely through the ion source chamber. The selected port(s) may be pre-existing or formed/created for such purpose. This technique may be employed for cleaning, without limitation, the ion source region, magnetic/analyzer region, vacuum system(s), process chamber, etc. of the implanter. Cleaning can be realized by flowing the cleaning gas continuously through and/or across the desired area(s) or region(s) of the implanter for a predetermined amount of time. Alternatively, or in combination therewith, the cleaning gas may be confined in the system for a predetermined amount of time to allow the cleaning gas to diffuse and react with the unwanted residues and/or deposits.

The present invention in various aspects provides an ion implantation system with the capability to grow/etch the filament in the ion source of the arc chamber, by appropriate control of temperature in the arc chamber to effect the desired filament growth or alternative filament etching.

Additional aspects of the invention relate to use of reactive gases such as $WF_x$, $AsF_x$, $PF_x$ and $TaF_x$, wherein x has a stoichiometrically appropriate value or range of values, for cleaning regions of ion implanters, or components of implanters in in situ or ex situ cleaning arrangements, under plasma or elevated temperature conditions.

A still further aspect of the invention relates to use of $BrF_3$ for cleaning of ion implant systems or component(s) thereof, in in situ or ex situ cleaning arrangements, under ambient temperature, elevated temperature, or plasma conditions.

The operation of an ion implantation system results in deposition of ionization-related materials in the system and its components. The invention contemplates monitoring, controlling and/or cleaning of the ion implantation system or one or more components thereof, for at least partial removal of such ionization-related deposits from the system and/or components thereof. The cleaning method involves contacting the system and/or components thereof with a cleaning composition comprising a gas-phase reactive material, under conditions enabling reaction of the gas-phase reactive material with the deposits to effect their at least partial removal.

In addition to the ionization-related deposits resulting from feedstock gases per se, it has also been found that deposits or residue formed within an ion implantation system may result from reactivity of feedstock gases with materials from which the system components are constructed. For example, the vacuum chamber of an ion implantation system may be constructed utilizing stainless steel or aluminum. System components within the vacuum chamber may be constructed utilizing graphite (e.g., standard or vitreous), insulator materials (e.g., boron nitride) and/or sealant materials such as Teflon®, Kel-F™, PEEK™, Delrin™, Vespel™, Viton™, Buna-N, silicon, etc. Other materials that can be present in the ion implantation system, and susceptible to deposit-producing chemical reactions therein, include, without limitation, ceramics, epoxy compositions containing lead oxide, aluminum nitride, aluminum oxide, silicon dioxide, and boron nitride.

The ion source itself can be constructed of tungsten, graphite, molybdenum or tantalum, sometimes with minor amounts of copper and silver. The ion source arc chamber is usually constructed of tungsten or molybdenum, or with a graphite body lined with tungsten or molybdenum. In such circumstance, a fluoride source feed material, e.g., $BF_3$, $GeF_4$, $SiF_4$, $AsF_5$, $AsF_3$, $PF_5$, and/or $PF_3$, reacts at operating temperatures with the material of the arc chamber, e.g., tungsten or molybdenum from the chamber or the lining of the chamber, to form an intermediate byproduct that in turn can migrate in the system and decompose to deposit tungsten or molybdenum and liberate fluorine.

For example, a feedstock gas such as $GeF_4$ will dissociate in the ion source chamber and the resulting free fluoride will attack the material of the arc chamber, such as tungsten. This reaction will occur with tungsten on a colder surface, so if the plasma is struck and the filament is therefore hot, the fluoride will react with the tungsten on the walls of the arc chamber, etching the walls and forming $WF_6$ gas. The $WF_6$ will then deposit tungsten on the hot filament, causing it to grow in size.

While $GeF_4$ produces large amounts of free fluorine, feedstock gases such as $BF_3$ or $SiF_4$ produce lesser amounts of free fluorine and correspondingly lower levels of tungsten deposition on the filament, which although lower, are still significant.

Non-fluorine-containing feedstock gases, such as $PH_3$ and $AsH_3$, can be problematic in causing metal from the filament to deposit onto walls of the arc chamber, with resultant thinning of the filament.

The present invention therefore contemplates cleaning of an ion implantation system or component(s) thereof, for at least partial removal of ionization-related deposits that are the same as the material of the arc chamber.

Cleaning in accordance with the invention can be carried out in ion implantation systems in which multiple feedstock gases are concurrently introduced to the system. Feedstock gases can also be used concurrently with one or more gas-phase reactive materials, or can be pulsed alternately with one or more gas-phase reactive materials into the system.

The ionization-related deposits to which the cleaning methods of the invention are directed, include a variety of materials that may interfere with normal operation of the ion implantation system, such as by forming and accumulating in the ion source or other ionization process equipment. The deposited material can variously comprise, consist, or consist essentially of, silicon, boron, phosphorous, germanium, arsenic, tungsten, molybdenum, selenium, antimony, indium, carbon, aluminum and/or tantalum.

Ionization-related deposits in the ion source arc chamber and on extraction electrodes can flake and form small particles. These particles, once formed, can be transported in an ion beam, e.g., a beam of dopant ions being implanted into a wafer. If such transported particles reach the wafer, the resulting particle contamination on the wafer can severely reduce the yield of useful devices that can be manufactured on the wafer. The cleaning processes of the present invention remove such ionization-related deposits before they are able to form flakes and particles, and thereby achieve reduction of particles on product wafers and increased yield of semiconductor devices.

The gas-phase reactive material, or cleaning gas, used for cleaning in accordance with the invention can include any material that is effective to at least partially remove the ionization-related deposits in the ion implantation system.

The invention also contemplates the use of gas-phase reactive materials to remove ionization-related deposits from undesired locations, and/or to deposit material in desired locations, by appropriate control of the reaction. In specific embodiments of the invention, tungsten constitutes the material being removed as an undesired deposit, and in other embodiments, tungsten is desirably deposited on surfaces benefiting from its presence. Accordingly, a gas that is reactive to form a tungsten fluoride intermediate product, such as $XeF_2$, $GeF_4$, $SiF_4$, $BF_3$, $AsF_5$, $AsF_3$, $PF_5$, and/or $PF_3$, can be used in the controlling and cleaning methods of the invention. Additionally, tungsten fluoride gases such as $WF_6$, $WF_5$, and/or $WF_4$ may be utilized directly in the controlling and cleaning methods of the invention. As such, gas-phase reactive materials of the invention include, but are not limited to, $XeF_2$, $GeF_4$, $SiF_4$, $BF_3$, $AsF_5$, $AsF_3$, $PF_5$, $PF_3$, $F_2$, $TaF_3$, $TaF_5$, $WF_6$, $WF_5$, and/or $WF_4$.

In various specific embodiments, the gas-phase reactive material can be co-administered with a "cleaning enhancement agent" or "co-reactant" that will increase the volatility of the gas-phase reactive material, resulting in removal of more deposits than with the gas-phase reactive material without the cleaning enhancement agent or co-reactant. For example, removal of iridium deposits by $XeF_2$ can be enhanced by co-administration of Lewis bases and electron back-bonding species. In specific applications, carbon monoxide, trifluorophosphine, and trialkylphosphines can be employed.

As a further example, in an ion implantation system in which feed gases are ionized in plasma sustained in an arc chamber having tungsten walls on which a filament on one side and a repeller on the other side are mounted and separated from the walls by ceramic insulators, the components of the arc chamber may become contaminated with decomposition products of feed gases, elements of the arc chamber, and carbon.

In such circumstance, a cleaning agent useful for removal of metal contaminants such as tungsten that form volatile fluorides, such as $XeF_2$, can be combined with an oxygen-containing additive that is effective for removing contaminant carbon by converting it to CO, $CO_2$, and/or $COF_2$. Oxygen-containing additive components useful for such purpose, in specific embodiments of the invention, include, without limitation, NO, $N_2O$, $NO_2$, $CO_2$ and/or $O_2$.

The invention therefore contemplates cleaning compositions including both a cleaning agent effective for removing a metal contaminant by reaction forming a volatile (gaseous) fluoride compound of such metal, and a cleaning agent effective for removing carbon contaminant by forming a volatile oxide or oxyfluoride therefrom. These cleaning reagents can be flowed into the arc chamber concurrently or sequentially.

In one embodiment, these reagents are concurrently flowed into the arc chamber under ionization conditions so that both cleaning agents are ionized to convert metal and carbon contaminants into volatile compounds that are easily removed from the chamber by mechanical pumping thereof.

The conditions enabling reaction of the gas-phase reactive material and the deposits may include any suitable conditions of temperature, pressure, flow rate, composition, etc. under which the gas-phase reactive material contacts and chemically interacts with the contaminant so as to remove such material from the substrate, e.g., the surface of the implanter equipment contaminated with deposited material.

Examples of various conditions that may be employed include, without limitation, ambient temperatures, temperatures in excess of ambient temperature, presence of plasma, absence of plasma, sub-atmospheric pressure, atmospheric pressure, and superatmospheric pressure.

Specific temperatures for gas-phase reactive material contacting to remove deposits in various embodiments can range from about 0° C. to about 2000° C. Contacting can involve delivery of the gas-phase reactive material in a carrier gas, or in a neat form, or in admixture with a further cleaning agent, dopant, etc. The gas-phase reactive material can be heated for chemical reaction with deposits that are at ambient temperature, in order to increase the kinetics of the reaction.

Reaction between the gas-phase reactive material and contaminant deposits can be monitored and/or regulated, based on varying characteristics of the reaction between the cleaning agent and the contaminant. Such reaction characteristics can include pressure, time, temperature, concentration, presence of a particular species, rate of pressure change, rate of concentration change (of a particular species), change of current, etc. Accordingly, the introduction of the gas-phase reactive material to the system can be terminated based on attainment of a predetermined characteristic of the reaction, such as a predetermined pressure in the vacuum chamber, passage of a predetermined amount of time, or a predetermined temperature, concentration of a specific element in the system, presence of a particular by-product, reaction product or other species in the system, or realization of a predetermined current condition in the monitoring operation.

Tungsten deposits can result from reaction of feed gases with the arc chamber of an implanter system. The method used in cleaning such deposits may be dependent on the temperature gradient of the system and/or the current flowing to and through the filament, and/or any other characteristics that are usefully determined and able to be monitored.

For example, fluorine from the feed material may react with the arc chamber at a first temperature to form $WF_6$ by reactions (1) or (2):

$$3F_2(g)+W(s) \rightarrow WF_6(g) \tag{1}$$

$$6F(g)+W(s) \rightarrow WF_6(g) \tag{2}$$

There may also be reaction between the cleaning gas and tungsten material of the arc chamber, such as:

$$3XeF_2+W \rightarrow 3Xe+WF_6 \tag{3}$$

Alternatively, $WF_6$ (or $WF_5$ or $WF_4$) may be provided directly to the system.

The tungsten fluoride once formed or otherwise present in the system can then migrate to another location in the system. Depending on the temperature of that other location, the tungsten fluoride will etch or deposit tungsten at that location. At the filament, the temperature will primarily depend on the actual current flux passing through it. Temperatures at other locations in the arc chamber may vary depending on the specific location and design of the arc chamber, the filament current, as well as other non-filament electrical currents.

If the second location is at high temperature, the tungsten fluoride is decomposed, tungsten is deposited and fluorine is released, with the tungsten deposit growing in size as long as tungsten fluoride continues to be present. Deposition reactions can include the following reactions (4), (5) and/or (6):

$$WF_6 \rightarrow W+3F_2 \tag{4}$$

$$2WF_5 \rightarrow 2W+5F_2 \tag{5}$$

$$WF_4 \rightarrow W+2F_2 \tag{6}$$

Contrarily, if the second location is at moderate temperature, the tungsten fluoride can etch that location, removing tungsten and retaining fluorine in the reaction product, so that the etched location shrinks as etching continues. Such etching reactions can include the following reactions (7), (8) and/or (9):

$$WF_6(g)+2W(s) \rightarrow 3WF_2(g) \tag{7}$$

$$2WF_6(g)+W(s) \rightarrow 3WF_4(g) \tag{8}$$

$$5WF_6(g)+W(s) \rightarrow 6WF_5(g) \tag{9}$$

Therefore, for removal of tungsten deposits, the temperature of the components bearing the deposits can be selected to maximize the rate and extent of removal.

In other embodiments of the invention, boron and/or molybdenum deposits in the arc chamber are removed in a corresponding manner.

The contacting of the cleaning agent with the process equipment in the process of the invention can be carried out with monitoring of the pressure change during the contacting, with the contacting being terminated when the pressure change goes to zero.

Alternatively the contacting may be conducted with monitoring of partial pressure of the gas-phase reactive material, or reactants deriving therefrom, or reaction products produced in the contacting, with the contacting being terminated when the partial pressure reaches a predetermined value, i.e., an end point. Such end point monitoring can for example be carried out with a suitable end point monitor, e.g., an end point monitor of a type as more fully described in U.S. Pat. No. 6,534,007 and U.S. patent application Ser. Nos. 10/273,036; 10/784,606; 10/784,750; and 10/758,825, or a thermopile infrared (TPIR) or other infrared detector.

In another embodiment, the contacting may be conducted by controlled flow of the gas-phase reactive material using components of the process equipment system that allow regulation of the partial pressure of gas-phase reactive material and therefore control of the reaction rate.

In still another embodiment, a continuous flow of the gas-reactive material, at a pre-determined flow rate, is employed to carry out the cleaning operation.

As discussed hereinabove with reference to reactions (1)-(9), ionization-related deposits of tungsten can be deposited at very high temperatures and etched at low to moderate temperatures. In this regard, ionization-related deposits mean deposits formed due to operation of the plasma, but not necessarily due to ions. Therefore, deposition of tungsten may also occur in the absence of plasma (e.g., there are no ions) as long as there is still a sufficiently hot surface. Where the location of the deposition or etching is the filament of the implanter system, the temperature and current flux are directly related to one another. When the filament is being etched, the filament becomes thinner and the resistance to electrical current will increase as the cross-section of the filament decreases, so that current flow through the filament is reduced. If the conditions at the filament promote deposition thereon, the resistance to electrical current will decrease with continued deposition, as the cross-section of the filament increases and the filament becomes thicker, with correspondingly increased current flow therethrough.

In another aspect, the invention relates to a method of monitoring the deposition on the source filament and resulting growth of the filament, involving monitoring of the current flow through the filament. As the filament cross-section increases due to deposition, the resistance to the electrical current will decrease and the current will increase in order to maintain the filament at the temperature required to support the plasma in the arc chamber. A monitored increase in current can therefore be used to indicate a need for filament cleaning.

In a further aspect, the invention relates to a method of monitoring etching or cleaning of the filament, by monitoring current flow through the filament. As the filament cross-section decreases due to etching, sputtering or evaporation, the resistance to the electrical current will increase and the current will decrease in order to maintain the filament at the temperature required to support the plasma in the arc chamber. A monitored decrease in such current can therefore be used to indicate a need for deposition of additional material to an etched filament, or for termination of a cleaning or ionization process.

Another implementation of the invention comprises a method of controlling the condition of the filament, based on monitoring of current flowed through the filament as detailed above.

In one embodiment, a decrease in the monitored filament current provides an indication that the filament is close to breaking, in response to which a gas-phase reactive material is flowed into the system, e.g., while the plasma is struck, or alternatively with the plasma off but the filament still hot (for example, ~2000° C.), to induce reaction producing deposition of metal on the filament, e.g., tungsten from the arc chamber walls. Such reaction may be allowed to proceed until the current is within a predetermined range for effective operation of the ion implantation system, indicating that the filament has been "regrown" to a satisfactory extent.

In another embodiment, an increase in the monitored filament current provides an indication that the filament is growing, due to material deposition. In response, a gas-phase reactive material is flowed into the system after allowing the filament to cool for a predetermined period of time, or to a predetermined temperature (which may for example be in a range of from room temperature up to about 2000° C.) so that the filament is cooled sufficiently to allow etching of the filament. The subsequent etching reaction mediated by the gas-phase reactive material may thereafter be allowed to proceed until the current is within a predetermined range for effective operation of the ion implantation system, indicating that the filament has been thinned to an appropriate level.

The method of the invention can therefore be used for removing from a substrate a deposit including at least one of boron, silicon, arsenic, phosphorus, germanium, tungsten, molybdenum, selenium, antimony, indium, tantalum and carbon, by contacting the substrate with a gas-phase reactive material for sufficient time to at least partially remove the deposit from the substrate. The gas-phase reactive material for such purpose may include one or more of $XeF_2$, $XeF_4$, $XeF_6$, $GeF_4$, $SiF_4$, $BF_3$, $AsF_5$, $AsF_3$, $PF_5$, $PF_3$, F2, TaF3, TaF5, $WF_6$, $WF_5$, $WF_4$, $NF_3$, $IF_5$, $IF_7$, $KrF_2$, $SF_6$, $C_2F_6$, $CF_4$, $Cl_2$, HCl, $ClF_3$, $ClO_2$, $N_2F_4$, $N_2F_2$, $N_3F$, $NFH_2$, $NH_2F$, HOBr, $Br_2$, $BrF_3$, $C_3F_8$, $C_4F_8$, $C_5F_8$, $CHF_3$, $CH_2F_2$, $CH_3F$, $COF_2$, HF, $C_2HF_5$, $C_2H_2F_4$, $C_2H_3F_3$, $C_2H_4F_2$, $C_2H_5F$, $C_3F_6$, $COCl_2$, $CCl_4$, $CHCl_3$, $CH_2Cl_2$, and $CH_3Cl$.

Fluorinated xenon compounds can be employed as cleaning agents and plasma source reagents in the practice of the invention, and can include any suitable number of fluorine atoms. A higher ratio of F to Xe enables relatively faster and more efficient cleaning, in relation to lower F/Xe compounds. Higher vapor pressures increase delivery rates of the cleaning agent and enable delivery of more material.

In one embodiment of the invention, xenon hexafluoride is employed as a cleaning agent or plasma source reagent. Although $XeF_6$ vapor pressure at room temperature is approximately seven times higher than that of $XeF_2$, $XeF_6$, as well as $XeF_4$, is very reactive with water. $XeF_6$ is most advantageously employed in cleaning environments not involving the presence or generation of water, hydrocarbons, hydrogen or reducing agents. However, when cleaning compounds with a lower vapor pressure are used, adjustments to the flow circuitry may be required in order to avoid undue pressure drops in the flow path and maintain suitably high delivery rates of the cleaning agent.

Apparatus to effectuate the methods of the invention may be constructed and arranged in any suitable manner to accommodate the cleaning with the gas-phase reactive material.

In one embodiment, the invention provides an ion implantation and cleaning assembly, comprising (i) an ion implantation system including one or more components accumulating ionization-related deposits thereon during ion implantation processing in the system, (ii) a cleaning assembly including a cleaning composition source containing a cleaning composition including a gas-phase reactive material, e.g., a halide compound that is reactive with the deposits to effect at least partial removal thereof from the one or more components under cleaning conditions involving contact of the cleaning composition with the deposits, (iii) flow circuitry adapted to transport the cleaning composition from the cleaning composition source to the one or more components for contacting therewith under the cleaning conditions, and (iv) flow componentry adapted to control flow of the cleaning composition through the flow circuitry during the cleaning conditions to effect the at least partial removal of the deposits from the one or more components.

The flow componentry in the above-described assembly can be of any suitable type, including for example valves, valve actuators, flow restrictors, regulators, pumps, mass flow controllers, pressure gauges, residual gas analyzers, central processing units, membranes, etc. Such flow componentry is suitably adapted to operate under the specific cleaning conditions employed.

The one or more components in the implanter apparatus that accumulate ionization-related deposits thereon during ion implantation processing in the system, can be of any suitable type, e.g., vacuum chambers, arc chambers, electrodes, filaments, high voltage bushings, magnet waveguides, wafer handling components, clamp rings, wheels, discs, etc. In one embodiment, the component is a vacuum chamber or a component contained therein.

The cleaning composition source may comprise a material storage and dispensing package containing the cleaning composition. The material storage and dispensing package includes a vessel that may, for example, be of generally cylindrical shape, defining an interior volume therein. In a specific embodiment, the cleaning composition may be a solid at ambient temperature conditions and such cleaning composition may be supported on an enhanced surface area within the vessel. Such enhanced surface area may include structures therein, such as trays, as described in U.S. Pat. No. 6,921,062, or porous inert foam, e.g., of anodized aluminum, stainless steel, nickel, bronze, etc., to provide a consistent rate of evaporation of the cleaning material and in turn provide sufficient vapor pressure for dispensing and ionizing steps of the associated cleaning process. Where trays are utilized, the cleaning composition may be supported on surfaces of trays having flow passage conduits associated therewith, for flow of vapor upwardly in the vessel to a dispensing port thereof, in dispensing operation.

The flow circuitry in the above-described equipment arrangement is adapted to transport the cleaning composition from the cleaning composition source to the arc chamber under cleaning conditions. Such adaptation may be based on various properties of the cleaning composition. For example, high conductance may be used to avoid unnecessary pressure drops in the flow path when the cleaning composition has a low vapor pressure. Methods of maximizing flow conductance and minimizing flow constriction are well known in the art.

In all cleaning methods of the invention, the cleaning may optionally be utilized with additional methods and apparatus for extending the lifetime of the ion implantation system, in particular the ion source. Such lifetime-extending approaches may include modification of an ion implantation system to accommodate specific substrate, deposited materials and/or gas-phase reactive materials. System apparatus modifications may include, without limitation, the provision of: extraction electrodes with active thermal control systems, actively heated extraction electrodes that reduce the frequency/occurrence of electrical discharges, extraction electrodes comprising metals, preferably aluminum, molybdenum or alumina ($Al_2O_3$), remote plasma sources, association of extraction electrodes with heaters, association of extraction electrodes with cooling devices, smooth, featureless extraction electrodes, plasma chambers arranged to receive source gases capable of being disassociated by plasma to produce flows of reactive gas through chamber outlets and conduits for transporting reactive gases to the ionization chamber, temperature detectors designed to detect substantial termination of exothermic reactions of the reactive gas with contamination on surfaces in process systems, protection of components in the process equipment that are susceptible to harm by gas-phase reactive materials (e.g., provision of shields against gas-phase reactive materials, around components that are sensitive to such materials), and/or use of system components comprising aluminum or alumina.

Methods to extend the lifetime of the process equipment may include, without limitation: actively heating extraction electrodes to reduce the frequency and occurrence of electrical discharges, heating extraction electrodes above the condensation temperature of source materials that are delivered to the ion source, actively controlling temperature of extraction electrodes adapted to the specific type of ion source employed (e.g., heating or cooling the electrode, in combination with a heated or cooled ion source), and/or maintenance of extraction electrodes at elevated temperature during extraction. Such additional apparatus modifications and methods are more fully described in U.S. Patent Application Publication Nos. 2006/0272776 and 2006/0272775 and International Patent Publication No. WO05/059942, hereby incorporated by reference in their entirety.

The ion implantation system in a specific embodiment includes an arc chamber and a dopant source, in which the dopant source may for example comprise $BF_3$, $XeF_2$, $AsH_3$, $PH_3$, $GeF_4$, $SiF_4$, $H_2Se$, $AsF_5$, $AsF_3$, $PF_5$, $PF_3$ or other boron, silicon, arsenic, phosphorus or germanium-containing dopant sources.

In another implementation, the invention relates to an ion implantation method, involving plasma generation in an arc chamber of an ion implantation system from a dopant source gas flowed through the arc chamber to form dopant source ions for implantation, wherein during at least part of the time during which the dopant source gas is flowed through the arc chamber, gas-phase reactive material is flowed through the arc chamber concurrently with the dopant source gas, to effect cleaning in the ion implantation system.

In general, although concurrent flow of the dopant source gas and gas-phase reactive material may be effected to achieve in situ cleaning, it typically is preferred to effect the cleaning operation in a sequential manner, e.g., when the ion source is generating a first plasma from a first dopant source, and subsequently the ion source is generating a second plasma from a second dopant source, an intervening cleaning step is employed, in which gas-phase reactive material is flowed through the ion source, with or without plasma generation.

In one embodiment, the invention provides a method of forming a doped silicon substrate, comprising implanting $Xe^+$ ions in a silicon substrate, and thereafter implanting dopant ions in the silicon substrate. In such process, implanting of the $Xe^+$ ions serves to amorphize the crystal structure of the substrate.

In the generation of a fluorinated xenon plasma, e.g., an $XeF_2$ plasma, for cleaning, $Xe^+$ ions may do some low energy sputter cleaning of the source itself. After extraction, the $Xe^+$ ions may do some high energy sputtering of components downstream of the ion source, such as vacuum walls, ion optical components, wafer discs and wafer holders.

Similarly, where tungsten fluoride species such as $WF_6$, $WF_5$, and/or $WF_4$ are utilized, free fluoride may sputter clean various components of the ion source and/or tungsten may be deposited on various components of the ion source. The action that occurs, as between cleaning and deposition, is dependent on the temperature of the individual components in the system.

The present invention in various aspects relates to a method and apparatus for cleaning the ion source region of an ion implantation system used in the fabrication of a microelectronic device. The ion source region may for example include an indirectly heated cathode source, a Freeman source or a Bernas source.

The present invention in one embodiment relates to in situ removal of residue from the vacuum chamber of the ion implanter and components contained therein by contacting the vacuum chamber and/or components with a gas-phase reactive halide composition for sufficient time and under sufficient conditions to at least partially remove the residue from the vacuum chamber and/or components, and to do so in such a manner that when the residue and the material from which the vacuum chamber and/or components are constructed is different, the gas-phase reactive material is selectively reactive with the residue and minimally reactive (e.g. substantially non-reactive, and preferably completely non-reactive) with the materials from which the vacuum chamber and/or components of the ion implanter are constructed; and when the residue and the material from which the vacuum chamber and/or components are constructed is the same, then the gas-phase reactive material may be reactive with both the residue and the vacuum chamber and/or components.

As used herein, the term "selectively," as applied to the reactivity of the gas-phase reactive halide with a residue, is used to describe a preferential reaction between the gas-phase reactive halide and a residue. While remaining essentially non-reactive with the materials from which the vacuum chamber and/or components of the ion implanter are constructed, the gas-phase reactive halide may react with some with the materials from which the vacuum chamber and/or components of the ion implanter are constructed if the vacuum chamber and/or components comprise elements that are the same as or similar to those of the residue itself. For example, while being selectively reactive and removing tungsten deposits from a component, the gas-phase reactive material might also react with tungsten in the component itself. The residue and the components do not have to be exactly the same material for such co-reaction to occur, but will comprise some materials in common.

In another embodiment, the ion implanter components are cleaned ex situ, in a separate dedicated chamber to which the components are removed from an ion implanter.

Considering in situ cleaning in further detail, such cleaning is primarily dependent on three factors: the reactive nature of the cleaning precursor, the volatility of the cleaning reaction by-products, and the reaction conditions employed in the chemical cleaning. The cleaning composition must remove unwanted residue while minimizing wear of the materials of construction of the implanter. The byproducts generated by the cleaning reaction must be volatile enough to facilitate their removal by the vacuum system of the ion implanter or other pumping apparatus.

The cleaning of residue formed from the same material as the component(s) of the implanter does result in some wear of the component itself. Specifically, use of $XeF_2$ as a cleaning agent to remove tungsten deposits from a system utilizing a tungsten arc chamber will result in removal of some tungsten from the interior of the arc chamber. However, in the interest of maximizing system efficiency, loss of some of the interior material of the arc chamber is not significant when viewed in light of the decreased system performance if the system is not cleaned and the tungsten deposits are allowed to accumulate in the system.

The gas-phase reactive material may for example include a fluorinated xenon compound vapor, such as $XeF_2$ vapor. $XeF_2$ is a preferred reactive halide gas, and will sublime at room temperature, but may be heated using a heater to increase the rate of sublimation. $XeF_2$ is known to be an effective silicon etchant and has been used as a silicon selective etchant in Micro Electro Mechanical System (MEMS) device processing. Specifically, $XeF_2$ reacts with silicon according to the following reaction.

$$2XeF_2(g) + Si(s) \rightarrow 2Xe(g) + SiF_4(g) \quad (10)$$

The silicon/$XeF_2$ reaction can occur without activation, i.e., without plasma or thermal heating. The reaction rate of $XeF_2$ with Si is much greater than the reaction rate of $XeF_2$ with $SiO_2$, making $XeF_2$ selective for reaction with Si.

$XeF_2$ or other fluorinated xenon compound is usefully employed in the practice of the invention as an etchant for metallic boron. Although not wishing to be bound by theory, it is thought that the boron is etched according to the following reaction (11):

$$3XeF_2(g) + 2B(s) \rightarrow 3Xe(g) + 2BF_3(g) \quad (11)$$

The use of $XeF_2$ as an etchant for arsenic, phosphorus and germanium is contemplated by the invention, and may involve the following reactions:

$$5XeF_2(g) + 2As(s) \rightarrow 5Xe(g) + 2AsF_5(g) \quad (12)$$

$$5XeF_2(g) + 2P(s) \rightarrow 5Xe(g) + 2PF_5(g) \quad (13)$$

$$2XeF_2(g) + Ge(s) \rightarrow 2Xe(g) + GeF_4(g) \quad (14)$$

Such reactions may be carried out with or without energetic activation.

The method and apparatus of the invention are useful to at least partially remove residue from the components of the ion implanter, e.g., with removal of at least 25%, more preferably at least 50% and most preferably at least 75% of such residue, and to do so in such a manner that residue is removed selectively with respect to the materials from which the components of the ion implanter are constructed, e.g., aluminum, tungsten, molybdenum, graphite, insulator materials, sealant materials, etc., when the residue material differs from those materials.

When the residue and the component material of construction are the same material, similar levels of residue removal are desired, while maintaining removal of material from the component at low levels, such as in the range of microns or tens of microns, so as not to significantly affect the performance of the component. Further, since deposits generally do not have a uniform thickness or deposition, they may be more reactive than the material of the component itself in the cleaning process, so that the gas-phase reactive material composition is more selective to reaction with the residue than to reaction with the component part.

Several modes of delivery of the gas-phase reactive material composition to the ion source region for in situ cleaning may be employed, including a stagnant mode, a continuous mode, and a direct introduction mode. Such modes of cleaning are more fully described in International Publication WO07/127865, together with apparatus and methodology that are usefully employed in the practice of the present invention. The disclosure of International Publication WO07/127865 is hereby incorporated herein by reference, in its entirety. Although use of $XeF_2$ as a cleaning composition is described herein in connection with various embodiments of the invention, it will be understood that other fluorinated compounds, such as $WF_6$, $WF_5$, and/or $WF_4$, may be used, alternatively to or in combination with XeF$_2$, or other and additional fluorinated compounds can be employed. For example, BrF$_3$ can be used to etch tungsten without a plasma. In another aspect, the invention relates to a method of improving the performance and extending the lifetime of an ion implant system that employs solid doping material which comprises using XeF$_2$ or N$_2$F$_4$ as a carrier gas for said solid doping material. The solid doping material includes, but is not limited to, elemental Arsenic, Phosphorus, Selenium, Antimony, SbF$_3$, InCl, SeO$_2$, Sb$_2$O$_3$ and InCl$_3$. As contemplated by the present invention, the use of XeF$_2$ or N$_2$F$_4$ as a carrier gas for Sb$_2$O$_3$, InCl$_3$ or other solid doping material, removes Sb, In and other dopants deposited on the source chamber and components thereof. The instant method has utility even if a switch over to boron is made after Sb implanting. Advantages gained by the method of the invention are at least two-fold: first, it provides real time source cleaning to prevent or reduce dopant accumulation on the ion source chamber and components thereof, thus improving ion source performance with prolongation of ion source life; second, it enhances and/or stabilizes the plasma and/or beam current.

In another aspect, the invention relates to a method of improving the performance and extending the lifetime of an ion implant system that employs gaseous doping material which comprises using XeF$_2$ or N$_2$F$_4$ as a co-flow gas with said gaseous doping material. The gaseous doping material includes, but is not limited to, GeH$_4$ and BF$_3$. As contemplated by the present invention, the use of XeF$_2$ or N$_2$F$_4$ as a co-flow gas with GeH$_4$ or other gaseous doping material, removes Ge or other dopants deposited on the source chamber and components thereof. Advantages obtained by this practice of the invention are at least two-fold: first, it provides real time source cleaning to prevent or reduce dopant accumulation on the ion source chamber and components thereof, thereby improving ion source performance and prolonging ion source life; second, it enhances and/or stabilizes the plasma and/or beam current.

In another aspect, the invention relates to a method of cleaning a foreline of an ion implant system to remove an ionization-related deposit therefrom comprising contacting the foreline of an ion implantation system with a cleaning gas under conditions in which said cleaning gas is chemically reactive with the deposit to effect at least partial removal thereof. Deposits include, but are not limited to those comprising B, Ge, Si, P, and As, or mixtures of same. The cleaning gas includes, but is not limited to XeF$_2$, N$_2$F$_4$, F$_2$, and other fluorinated species which are reactive with a deposit as constituted aforesaid. As appreciated by those in the art the amount of cleaning gas needed is dependent on the amount of deposit present. Similarly, the amount of heat given off during the reaction of the cleaning gas and the deposit is dependent on the flow rate of the cleaning gas. The identity and concentration of byproduct species that result from the cleaning process depends on cleaning gas flow rate, the compositional make-up of the deposits, and the pump purge flow rate. For non-limiting illustrative purposes only, an example of using XeF$_2$ to clean phosphorus from a foreline is described below:

The chemical reaction used to determine the quantity of XeF$_2$ required in the cleaning process is: $5XeF_2(g)+2P(s) \rightarrow 5Xe(g)+2\,PF_5(g)$. The enthalpies of formation (in kJ/mol) are taken from Lange's Handbook of Chemistry (14$^{th}$ ed) and are listed here for the determination of the heat liberated during the reaction: XeF$_2$ (−164); Xe (0); P (0); and PF$_5$ (−1594.4). The flow rate of XeF$_2$ determines the length of time required for the cleaning process as well as the heat liberated. Without providing a means of heating the XeF$_2$ cylinder, the maximum sustained flow rate is approximately 50 sccm, assuming adequate delivery tubing conductance. This flow rate can be increased to 100 sccm or greater if the cylinder is maintained at room temperature by using a heating jacket. The amount of XeF$_2$ needed to clean the phosphorus deposit is shown in Table 1, and the amount of heat given off during the cleaning reaction is shown in Table 2.

TABLE 1

| Mass of Phosphorus Deposits (g) | Mass of XeF2 Required (g) |
|---|---|
| 10 | 137 |
| 100 | 1367 |
| 1000 | 13,666 |

TABLE 2

| Flow Rate of XeF2 (sccm) | Rate of Heat Generation (watts) |
|---|---|
| 50 | 17.6 |
| 100 | 35 |
| 200 | 70 |

The maximum production rate of various byproducts from the above-described cleaning reaction is shown in Table 3.

| Flow Rate of XeF2 (sccm) | AsF3 | PF3 | BF3 | GeF4 | SiF4 |
|---|---|---|---|---|---|
| 50 | 0.20 g/min (33.3 sccm) | 0.13 g/min (33.3 sccm) | 0.10 g/min (33.3 sccm) | 0.17 g/min (25 sccm) | 0.12 g/min (25 sccm) |

As appreciated by those in the art, because the composition of the residues may vary, the data shown in Table 3 is based upon the assumption that the byproduct quantities are determined for each element assuming 100% compositional make-up of that element. Furthermore, the maximum concentrations of these species are dependent upon the dilution flow rates in the exhaust systems. For example, just downstream of the roughing pump, the maximum steady state concentration of PF$_3$ is 3330 ppm if the pump has a nitrogen purge of 10 slpm. This value can increase if the flow rate of XeF$_2$ is higher than 50 sccm.

In one embodiment of the above-described method, the cleaning gas flows into the implant source chamber, with the turbo pump off, but the roughing pump on. This practice improves the flow rate of the cleaning gas over foreline deposits thus providing a faster cleaning process. Cleaning gas flow rate can be further improved by heating the gas cylinder wherein the cleaning gas is stored to up to room temperature or above. Preferably, in this practice, the delivery lines from the gas cylinder to the ion implanter are similarly heated.

In another embodiment of the above-described method, the cleaning gas flows into the implant source chamber in a pulsed flow in which the implant source chamber, the pump and the forelines are filled to a certain pressure and then pumped to lower pressure. This process is repeated until the deposit on the foreline of the ion implant system is removed. This practice preferably employs an isolation valve on the inlet of the roughing pump.

In a preferred practice, the above-described embodiment further comprises heating the gas cylinder wherein the cleaning gas is stored to room temperature or above.

For all embodiments, the method preferably further comprises a scrubber at the roughing pump outlet to remove the volatile byproducts produced from the cleaning process.

Each embodiment preferably further comprises a Xe recovery system as commercially available from Air Products and Chemicals, Inc. (PA, USA), and is described in http://www.fabtech.org/product_briefings/_a/new_product_air_products_offers_on_site_xenon_recovery., incorporated herein.

Another embodiment of the method of cleaning a foreline of an ion implant system comprises providing the cleaning gas downstream of a turbo pump and flowing said cleaning gas continuously to the foreline of the ion implant system. The continuous flowing of said cleaning gas can be directly into the source housing, the region between the source housing and the source turbo pump, or downstream of the source turbo pump. This practice preferably cleans the deposits on the foreline even when the implant processes are running, thereby reducing the disruption of the operation of ion implanting.

In the above-described embodiment, the cleaning gas is preferably stored in a gas cylinder; the method preferably further comprises heating the gas cylinder wherein the cleaning gas is stored at room temperature or above.

The above-described embodiment preferably further comprises providing a scrubber at the roughing pump outlet to remove the volatile byproducts produced from the cleaning process.

The above-described embodiment further comprises providing a Xe recovery system as commercially available from Air Products and Chemicals, Inc. (PA, USA), and is described in http://www.fabtech.org/product_briefings/_a/new_product_air_products_offers_on_site_xenon_recovery., incorporated herein.

In another aspect, the invention relates to a method of improving the performance and extending the lifetime of an ion implant system having a cathode comprising contacting the cathode with a gas mixture comprised of at least one cleaning gas and at least one deposition gas wherein said gas mixture balances the deposition of material on the cathode and the stripping off of the same or other material from the cathode. The cleaning gas of the gas mixture removes dopant material deposited on the cathode and the material of the cathode, whereas the deposition gas of the gas mixture directly or indirectly causes deposition of dopant material onto the cathode. Such a gas mixture maintains a balance between the accumulation of dopant material and stripping off of the same or other material on the cathode, and therefore prolongs the ion source life. It will be appreciated that not only dopant material can be deposited or etched, but also the material of the arc chamber walls, e.g., W or Mo, can be deposited or etched. The cleaning gas either directly (via sputtering or chemical etching), or indirectly (via chemical gettering of tungsten/molybdenum fluorides) prevents deposition or reduces the rate of deposition. The deposition gas causes deposition on the cathode via the halogen cycle (fluorine from the gas etches W or Mo from the cooler wall and then decomposes the W or Mo onto the very hot cathode), or by actually depositing a dopant molecule/atom on the cathode (e.g. B from $BF_3$), and a similar mechanism applies to the filament of a Bernas ion source. For the case of dopant deposition on insulators or other sensitive components of the arc chamber, the cleaning gas tends to chemically etch the dopant deposits that are formed, or the cleaning gas may react with the deposition gas prior to dopant deposition in the first place to prevent or minimize deposition. By way of example of how a cleaning gas may prevent deposition in the first instance: a deposition gas of $GeH_4$ could cause Ge deposits to form on the cathode, insulators, or other components. If the cleaning gas is $XeF_2$, it can react with the $GeH_4$ to from at least some amount of $GeF_2$ and/or $GeF_4$, which is far more volatile than Ge, and can thus be removed from the source region via pumping. Further, either or both the deposition gas and the cleaning gas may also be the dopant gas. Storage and dispensing of the gas mixture into ion source implanter may be accomplished by using an adsorption-desorption apparatus (referred to as SDS—safe delivery source) described in U.S. Pat. No. 5,518,528, and the contents of which are incorporated herein by reference; a fluid storage and dispensing system comprising a vessel for holding a fluid at a desired pressure (referred to as VAC Vacuum Actuated Cylinder) described in U.S. Pat. No. 6,101,816, and the contents of which are incorporated herein by reference; or a hybrid fluid storage and dispensing system of SDS and VAC (referred to as VAC-Sorb) described in U.S. Pat. No. 6,089,027, and the contents of which are incorporated herein by reference. These fluid storage and dispensing systems provide subatmospheric pressure delivery of the gases, and thereby are safer and more efficient than the high pressure fluid storage and dispensing systems. Moreover, some of the gases of the gas mixture, which are not compatible to co-exist under high pressure fluid storage and dispensing system, can be stored and dispensed together under the SDS, VAC or VAC-Sorb systems.

In one embodiment of the above-described method, gases of the gas mixture flow simultaneously to contact the cathode or other sensitive component susceptible to deposition.

In another embodiment of the above-described method, gases of the gas mixture flow sequentially to contact the cathode or other sensitive component susceptible to deposition.

In another embodiment of the above-described method, the gas mixture comprising a combination of at least one hydrogen-containing gas and at least one fluorine-containing gas wherein the hydrogen-containing gas functions as the cleaning gas, and the fluorine-containing gas functions as the deposition gas.

In another embodiment of the above-described method, the gas mixture comprises a combination of at least one non-dopant gas, i.e., gas does not contain As, P, Ge, B, Si, or C, and at least one dopant gas wherein the non-dopant gas functions as the cleaning gas, and the dopant gas functions as the deposition gas.

Examples of cleaning gas are, but not limited to, $Xe/H_2$, $Ar/H_2$, $Ne/H_2$, $Xe/NH_3$, $Ar/NH_3$, $Ne/NH_3$, $Ar/Xe$, and $Ar/Xe/H_2$.

Examples of deposition gas are, but not limited to, $F_2$, $N_2F_4$, $ClF_3$, $WF_6$, $MoF_6$, $GeF_4$, and $NF_3$.

Examples of the gas mixture are, but not limited to, $AsH_3/AsF_3$, $AsH_3/AsF_5$, $PH_3/PF_3$, $PH_3/PF_5$, $SiH_4/SiF_4$, $H_2/Xe/SiF_4$, $GeH_4/GeF_4$, $H_2/Xe/GeF_4$, $H_2/GeF_4$, $B_2H_6/BF_3$, $H_2/BF_3$, $F_2/BF_3$, $CO_2/F_2$, $CO_2/CF_4$, $CO/F_2$, $CO/CF_4$, $COF_2/F_2$, $COF_2/CH_4$, $COF_2/H_2$.

The features and advantages of the invention are more fully shown by the following non-limiting examples.

EXAMPLE 1

This example shows the improvement in ion source lifetime and implanter utilization that is achievable by use of a chemical cleaning agent to remove deposits. Preferably, the deposits are removed at regular intervals to prevent buildup of contaminant flakes and conductive films in the implanter.

In-situ cleaning was carried out by introducing $XeF_2$ at regular intervals from a supply vessel thereof positioned in the gas box of the ion implanter, with $XeF_2$ cleaning vapor introduced into the ion source for 10-15 minutes twice a day. A high current implanter was utilized for testing to assess flow dynamics of the cleaning reagent. $XeF_2$ cleaning properties were determined and it was verified that the cleaning agent had no adverse effect on the implanter's beamline components. The cleaning process using the $XeF_2$ reagent then was qualified for use with a medium current implanter apparatus.

FIG. 1 is a graph of compiled source lifetime data from such medium current implanter, prior and subsequent to implementation of the in-situ cleaning process. The data were developed for a dopant composition including arsine and phosphine. Before cleaning, the ion source had an average operating life of approximately 250±90 hours, limited by two common failure modes.

The predominant mode of failure was excessive leakage from a suppressor voltage supply. For successful extraction of a stable ion beam, suppressor voltage is applied to an electrode positioned outside of the arc chamber. The electrode is electrically isolated by a number of small insulators, and buildup of a conductive film on one or more of these insulators can cause excessive suppressor leakage.

A secondary mode of failure was shorting out of components in the arc chamber attributable to flakes of deposited material.

These failure modes were found to be minimized by the in-situ chemical cleaning process. Regular twice-daily cleaning increased source lifetime on the production.

Figure 2:
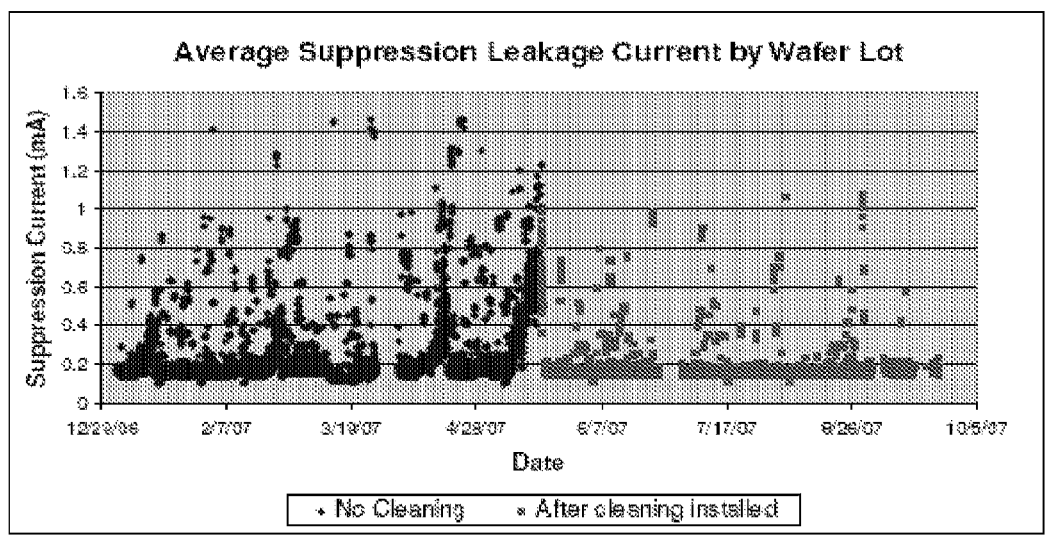
FIG. 2 is a graph showing effect of $XeF_2$ on the suppressor leakage current, as detailed in Example 1.

The effect of $XeF_2$ on the suppressor leakage current is further shown in FIG. 2, which is a graph of the leakage current for the medium current tool before and after introduction of in-situ cleaning. Each data point represents an average suppressor current during the time required to implant a wafer lot, and points have been plotted over the lifetime of several ion sources. The magnitude of the leakage depends on the elapsed time since replacement of insulators at the last preventive maintenance. The data show that regular in-situ cleaning greatly reduced leakage current so that it never reached the upper control limit of 1.5 mA at which an unscheduled source maintenance is required.

In-situ cleaning effects were also evaluated, using an implant dopant mix including $BF_3$ and $PH_3$. The source ran for 497 hours under these conditions and failed for an arc limited condition involving tungsten or boron deposits on the filament, attributable to the $BF_3$ chemistry. The single source life of 497 hours on the test system compares favorably with the long term historical average of 299 hours on the same system. This is a single data point, but it fits the established pattern. The source life improvement in this case appears to be due to etching by $XeF_2$ of tungsten deposits in the source arc chamber.

Figure 3A:
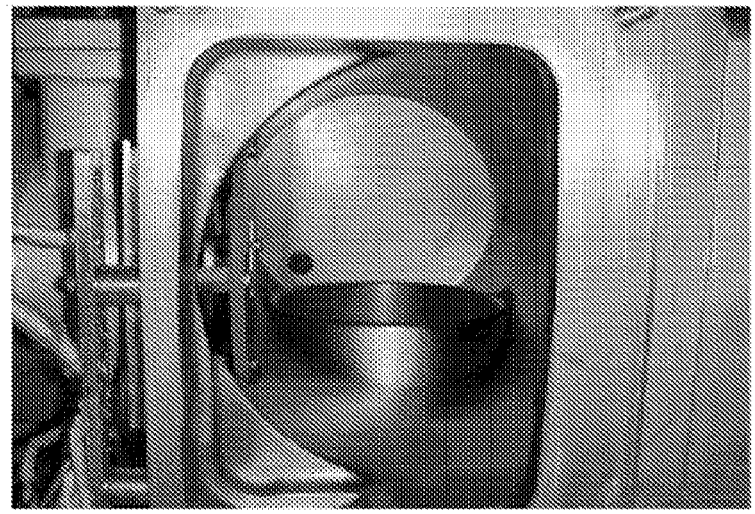
FIGS. 3A and 3B are photographs showing evidence of the cleaning effects in situ cleaning, as detailed in Example 1.
Figure 3B:

The FIGS. 3A and 3B photographs provide additional evidence of the effect of the cleaning agent. In both photographs the appearance of the ion source housing after removal of the ion source assembly for periodic preventive maintenance is shown, after about 98 days of production in each instance. For the photograph in FIG. 3A, in situ cleaning was conducted twice daily, while for the photograph in FIG. 3B no cleaning had been performed.

In the absence of cleaning, substantial quantities of deposited material were present, some of which had begun to delaminate and flake. During regular maintenance activity, manual scrubbing was used to remove deposited material from internal surfaces of the housing. The housing appeared much cleaner with in situ cleaning, with little or no time being spent on manual cleaning. Deposits were removed by unreacted $XeF_2$ flowing out of the arc chamber, and passing to the vacuum chamber walls, dopant and other deposits were removed by chemical reaction.

Deposits in and around the ion source give rise to the so-called "implanter memory effect." When changing from one dopant source gas to another, ions from elements of the first dopant continue to be extracted from the ion source plasma long after flow of the first dopant gas has been terminated. This effect in some instances causes severe contamination of the desired ion beam and resulting degradation of the implant process.

One example of the implanter memory effect is P contamination in a $BF_2$ implant. The consequences of this contamination to yield of the process are so severe that many semiconductor manufacturing facilities avoid scheduling phosphorus and boron implants on the same tool. This is a substantial impediment in scheduling implant operations. $P/BF_2$ contamination results from phosphorus deposits in the source from implantation with $PH_3$. Upon change-over to $BF_3$ gas for $BF_2^+$ implantation, some of the fluorine reacts to form $^{31}P^{19}F^+$. The mass of $^{31}P^{19}F^+$ is 50. This is sufficiently close enough to the desired mass for $^{11}B^{19}F_2$ of 49, so that $PF^+$ is co-implanted with the $BF_2^+$ ions. As a result, $BF_2^+$ implantation is restricted on some high current systems with marginal mass resolution capability at specific mass-energy ranges.

$XeF_2$ cleaning was assessed to determine its affect on the implanter memory effect, using a high current implanter operated for approximately 200 hours in simulated production with a $P^+$ ion beam from $PH_3$ dopant gas. The system was switched to $BF_3$ gas and immediate implantation of a bare silicon monitor wafer was carried out using a high dose ($5 \times 10^{15}$ ions/cm$^2$) of $BF_2^+$. During $BF_2^+$ implantation, the resolving aperture of the system's analyzing magnet was opened more than usual to ensure that the contamination effect would be sufficiently large for convenient measurement using secondary ion mass spectrometry (SIMS) analysis.

Figure 4A:
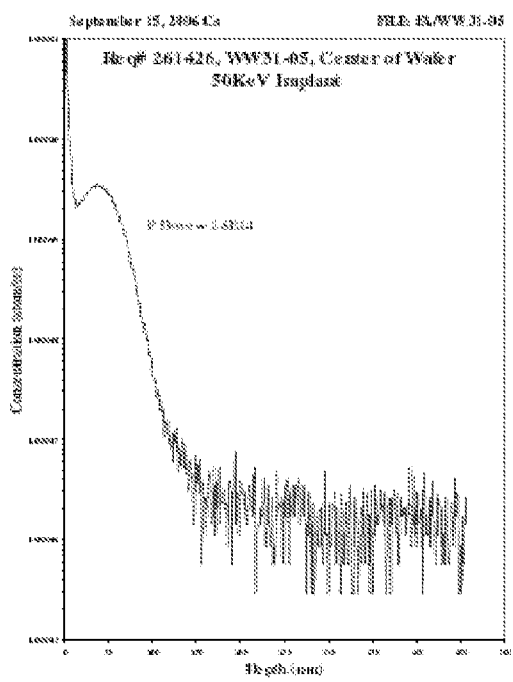
FIGS. 4A and 4B show cleaning effects in situ cleaning, as detailed in Example 5.

Cleaning effects of $BF_3$, argon and $XeF_2$ were compared by running each of the 3 gases and then periodically monitoring the amount of remaining contamination by implanting monitor wafers with $BF_2^+$. The amount of P co-implanted with the $BF_2$ was measured by SIMS. A typical SIMS spectrum of implanted phosphorus is shown in FIG. 4A, in which the peak in the phosphorus spectrum corresponds to the implanted depth of Pr ions extracted from the ion source, and the dose corresponds to a contamination level of about 3% PF in $BF_2$.

Figure 4B:
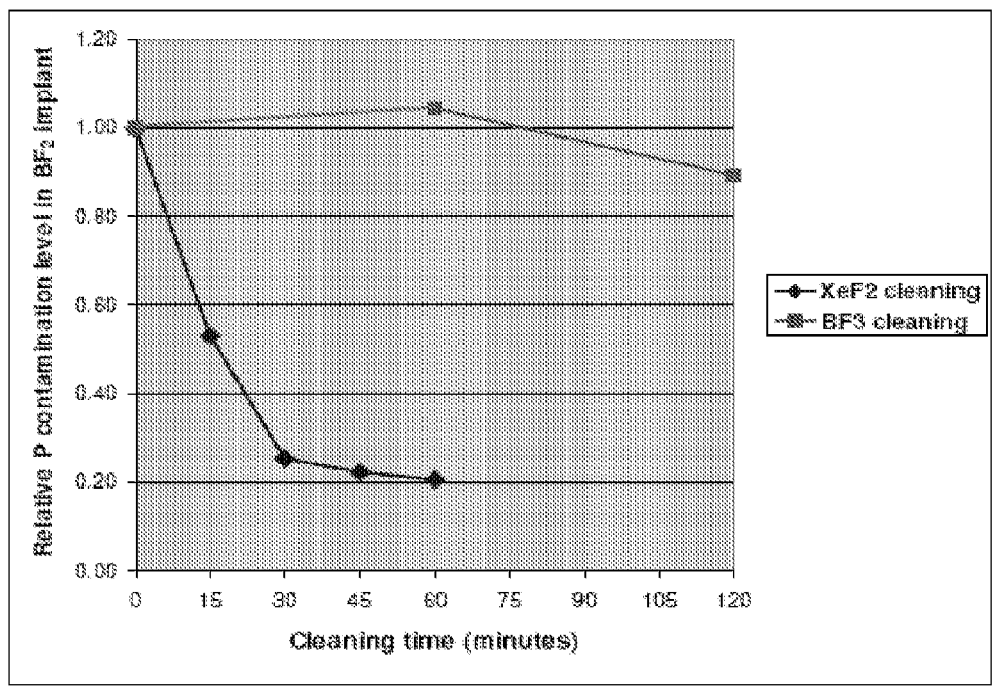

FIG. 4B is a plot of the contamination level as a function of cleaning time with either $BF_3$ or $XeF_2$, in which the plot is normalized to the contamination level immediately after change-over from $PH_3$ to $BF_3$. There was little effect on the PF contamination even after 2 hours when running $BF_3$ plasma. Similar results (not shown) obtained when argon plasma was used. By contrast, PF contamination was reduced by a factor of two after only 15 minutes of in-situ cleaning with $XeF_2$, and by a factor of almost five after 30 minutes of in-situ cleaning with $XeF_2$.

Prior to use of in-situ cleaning, the medium current implanter unit averaged 3.3 source changes per tool per month, with average source change-over and subsequent qualification testing requiring approximately 5 hours, equivalent to nearly 200 hours annually of lost production time per tool. The source life was effectively doubled by in-situ cleaning, yielding about 100 hours of additional production time for each medium current tool. The resulting savings of test wafers, as well as savings in fabrication time and metrology tools needed for post processing of qualification wafers (with up to 40 qualifications annually being carried out for each medium current implanter), demonstrated the effectiveness of the in-situ cleaning.

EXAMPLE 2

This example demonstrates the control of filament growth, in an ion source of an illustrative ion implanter system.

Figure 5A:
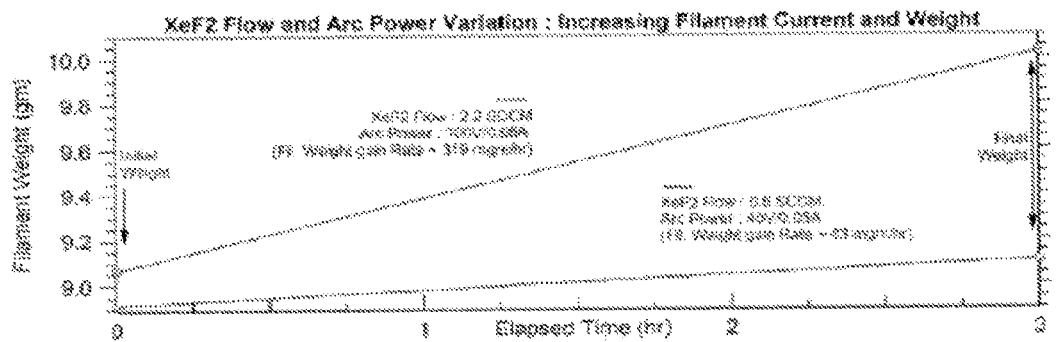
FIGS. 5A and 5B are graphs of the increasing filament weight (FIG. 5A) and filament current (FIG. 5B) over an elapsed time period with $XeF_2$ flow.

FIG. 5A is a graph showing the effects of $XeF_2$ flow and arc power variation, with respect to increased filament current and weight. The graph shows filament weight in grams, as a function of elapsed time, in hours, of operation of the implanter system. The upper line in the graph represented operation at an $XeF_2$ flow of 2.2 standard cubic centimeters per minute (sccm) and arc power of 100 volts/ 0.05 amps, for which a filament weight gain of 319 milligrams/hour was determined after 3 hours of operation. The lower line in the graph reflected an $XeF_2$ flow of 0.5 sccm and arc power of 40 volts/0.05 amps, which produced a filament weight gain of 63 milligrams/hour for the 3 hour duration of operation.

Figure 5B:
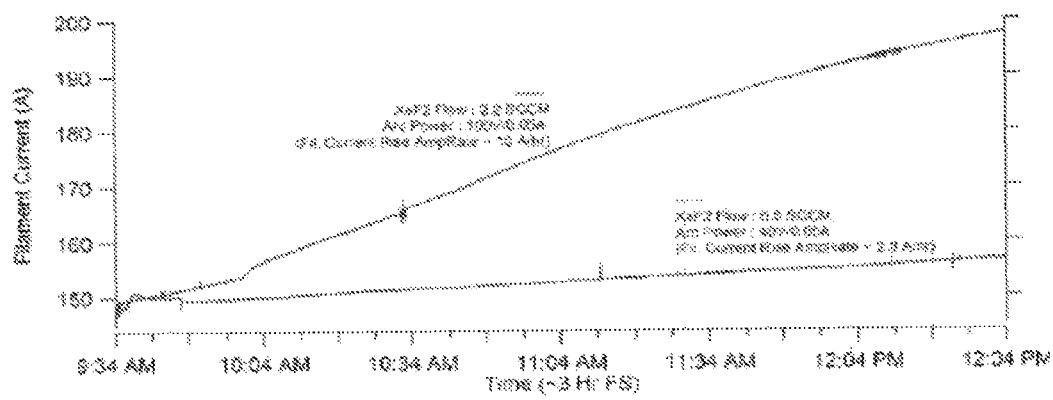

FIG. 5B is a graph showing the effects of $XeF_2$ flow and arc power variation, with respect to filament current. The graph shows filament current in amperes, as a function of time of operation of the implanter system. The upper line in the graph represented operation at an $XeF_2$ flow of 2.2 standard cubic centimeters per minute (sccm) and arc power of 100 volts/0.05 amps, for which a filament current rise of 16 amps/hour was determined. The lower line in the graph reflected an $XeF_2$ flow of 0.5 sccm and arc power of 40 volts/0.05 amps, which produced a filament current rise of 2.3 amps/hour for the 3 hour duration of operation.

Figure 6:
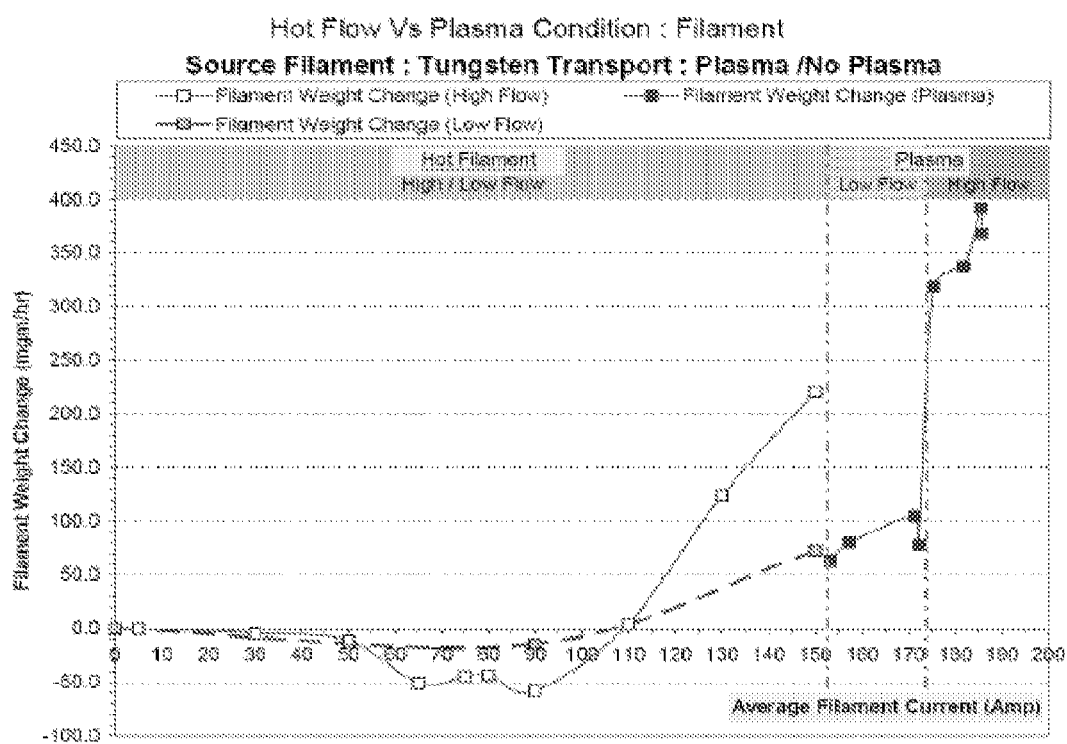
FIG. 6 is a graph of the filament weight change as a function of filament current, with regard to tungsten transport within the system with $XeF_2$ flow.

FIG. 6 is a graph of filament weight change, in milligrams per hour, as a function of average filament current, in amperes. The graph shows the effect of hot flow (no plasma) and plasma conditions for tungsten transport, with data for low flow and high flow hot filament conditions, and for low flow and high flow plasma conditions. These data show that the transport of tungsten in the system can be selectively adjusted by selection of appropriate process conditions to effect deposition, or alternatively etching, of material at the filament.

EXAMPLE 3

Figure 7:
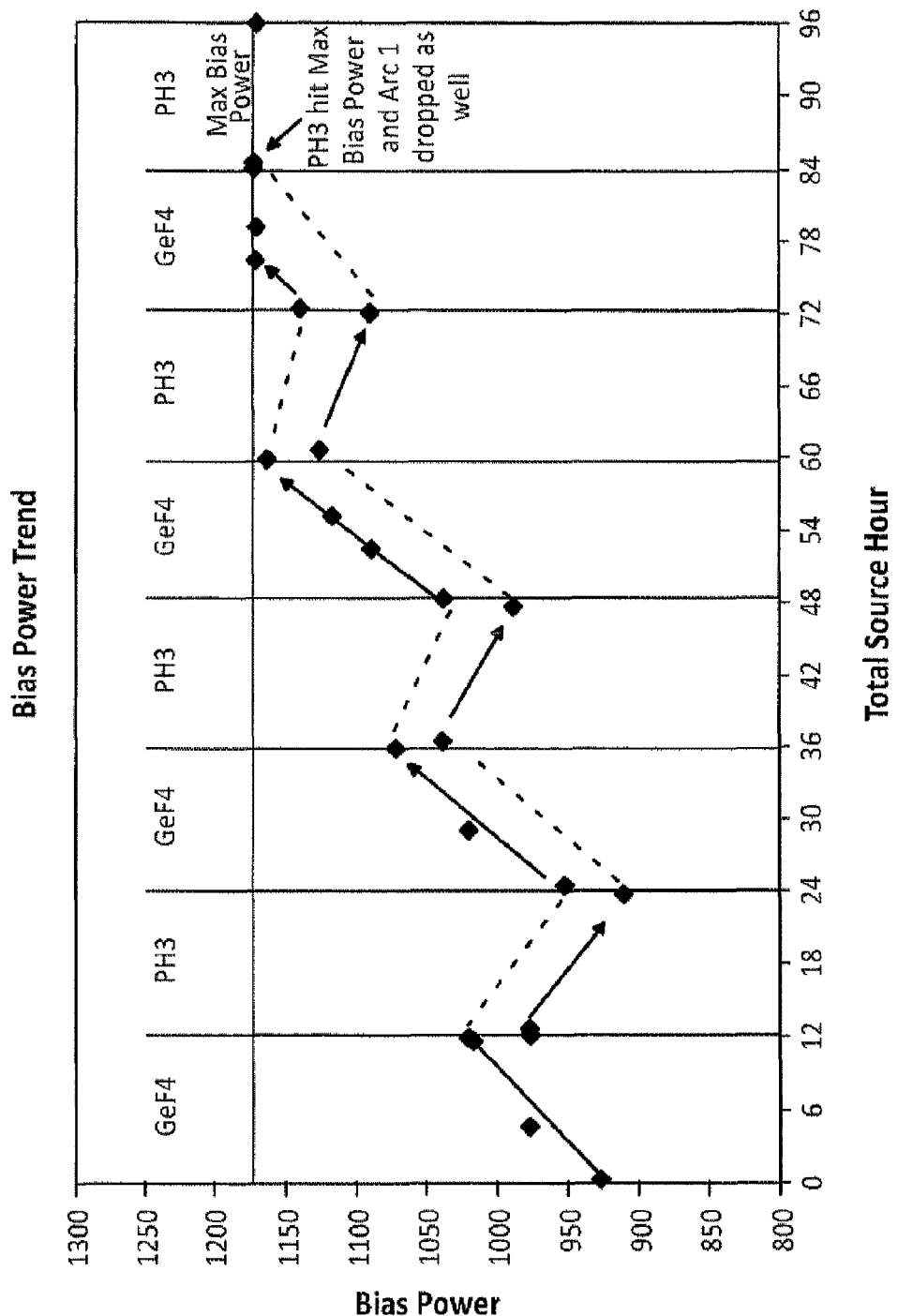
FIG. 7 is a graph showing the change of cathode bias power as a function of time and gas type.

This example shows the improvement in ion source lifetime and implanter utilization that is achievable by monitoring cathode bias power supply. FIG. 7 is a graph showing the change of cathode bias power as a function of time and gas type. Specifically, when $GeF_4$ is flowed, the halogen cycle causes W to be deposited onto the cathode, which causes the bias power to increase (in order to maintain the set ion beam current). When $PH_3$ is flowed, phosphorus ions sputter the cathode, resulting in a drop in cathode bias power. In this example, the ratio of $PH_3$ to $GeF_4$ was such that ultimately the bias power reached its maximum output after about 76 hours. Monitoring the bias power in this way, and taking appropriate action will enable an improvement in ion source life.

Figure 8:
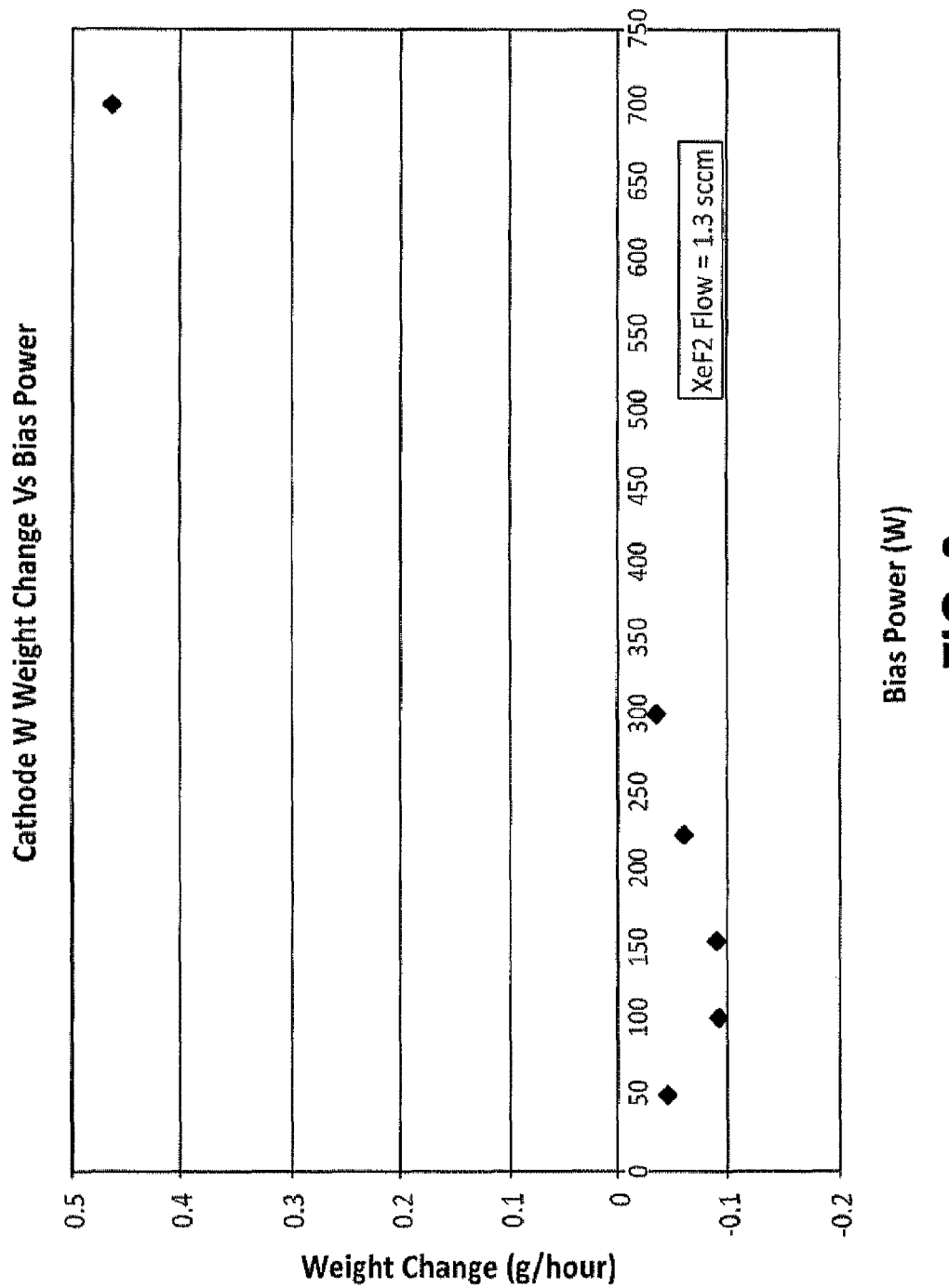
FIG. 8 is a graph showing the cathode W weight change as a function of bias power.

FIG. 8 is a graph showing the cathode W weight change as a function of bias power. Specifically, using $XeF_2$ as the source gas, tungsten (W) can either be etched from the cathode or deposited onto the cathode by simply changing the cathode bias power. A high bias power increases the temperature of the cathode to a level where the W deposition reaction is favored, while low to moderate bias powers reduce the temperature to conditions in which the W etching reaction is favored. Depending on the state of the cathode, the bias power can be selected to either etch unwanted deposits from the cathode, or to deposit needed W back onto the cathode, and thus enable an improvement in ion source life.

While the invention has been described herein with reference to various specific embodiments, it will be appreciated that the invention is not thus limited, and extends to and encompasses various other modifications and embodiments, as will be appreciated by those ordinarily skilled in the art. Accordingly, the invention is intended to be broadly construed and interpreted, in accordance with the ensuing claims.

What is claimed is:

1. A method of controlling the condition of an indirectly heated cathode source in an ion implantation system comprising:
    detecting a decrease in power usage of the indirectly heated cathode by determining power usage for the indirectly heated cathode source by measuring cathode bias power at a predetermined time and comparing the power usage at the predetermined time to initial power; and
    regrowing the indirectly heated cathode by flowing a fluorinated gas in a plasma condition over the indirectly heated cathode, wherein the fluorinated gas comprises $XeF_2$.

2. The method of claim 1 further comprising:
    detecting an increase in a power usage of the indirectly heated cathode by
    i) determining power usage from the indirectly heated cathode source by measuring cathode bias power at an additional predetermined time; and
    ii) comparing the power usage at the additional predetermined time to initial power; and etching the indirectly heated cathode.

3. The method of claim 2 wherein the etching includes operating the indirectly heated cathode under conditions of low to moderate temperature sufficient for etching.

4. The method of claim 3, wherein the low to moderate temperature is from about room temperature up to about 2000° C.

5. The method of claim 1 wherein the regrowing includes operating the indirectly heated cathode under conditions of high temperature sufficient for metal deposition to occur.

6. The method of claim 5, wherein the high temperature sufficient for metal deposition to occur is greater than 2000° C.

7. The method of claim 1, wherein the fluorinated gas comprises $N_2F_4$.

* * * * *